(12) United States Patent
Wischnewskiy

(10) Patent No.: US 6,806,620 B1
(45) Date of Patent: Oct. 19, 2004

(54) PIEZOELECTRIC DRIVE EXCITED BY LONGITUDINAL AND FLEXURAL WAVES

(75) Inventor: Wladimir Wischnewskiy, Waldbronn (DE)

(73) Assignee: PI Ceramic GmbH Keramische Technologien und Bauelemente, Lederhose (DE)

( * ) Notice: Subject to any disclaimer, the term of this patent is extended or adjusted under 35 U.S.C. 154(b) by 74 days.

(21) Appl. No.: 10/048,991
(22) PCT Filed: Jul. 31, 2000
(86) PCT No.: PCT/EP00/07385
§ 371 (c)(1),
(2), (4) Date: Nov. 7, 2002
(87) PCT Pub. No.: WO01/13505
PCT Pub. Date: Feb. 22, 2001

(30) Foreign Application Priority Data

Aug. 17, 1999 (DE) ......................................... 199 38 954

(51) Int. Cl.[7] .............................................. H01L 41/08
(52) U.S. Cl. .............................. 310/323.02; 310/323.16
(58) Field of Search ....................... 310/323.02, 323.16, 310/317, 319, 316.01

(56) References Cited

U.S. PATENT DOCUMENTS 4,019,073 A * 4/1977 Vishnevsky et al. ........ 310/322

6,064,140 A * 5/2000 Zumeris ................. 310/323.02
6,218,769 B1 * 4/2001 Iino et al. .................... 310/328

FOREIGN PATENT DOCUMENTS

| EP | 0 725 476 | 8/1996 |
|----|-----------|--------|
| EP | 0 878 853 | 11/1998 |
| JP | 2-041673 | 2/1990 |
| JP | 2-055585 | 2/1990 |

* cited by examiner

*Primary Examiner*—Mark Budd
(74) *Attorney, Agent, or Firm*—Oblon, Spivak, McClelland, Maier & Neustadt, P.C.

(57) ABSTRACT

The invention relates to a piezoelectric drive, containing a driven element (1) fitted with a friction layer (2) and at least one solid-state plate-shaped piezoelectric transformer (6) as driving element. The length of the transform (L) does not match its width (H). First and second groups of electrodes (12, 13) are provided on the surfaces (7) of the transformer. The first and the second groups of electrodes have areas with identical configuration on the opposite large-surface metallized surfaces of the plate-shaped piezoelectric transformer. Each group of electrodes forms at least one independent transformer of the acoustic waves that are not coupled to one another and which propagate along the long side of the piezoelectric transformer. Hence, the first group of electrodes (12) operates as longitudinal wave generator (17) while the second group of electrodes (13) operates as flexural wave generator (18) of the acoustic waves.

32 Claims, 36 Drawing Sheets

136

137

138

139

154

155

PIEZOELECTRIC DRIVE EXCITED BY LONGITUDINAL AND FLEXURAL WAVES

Figure 1:
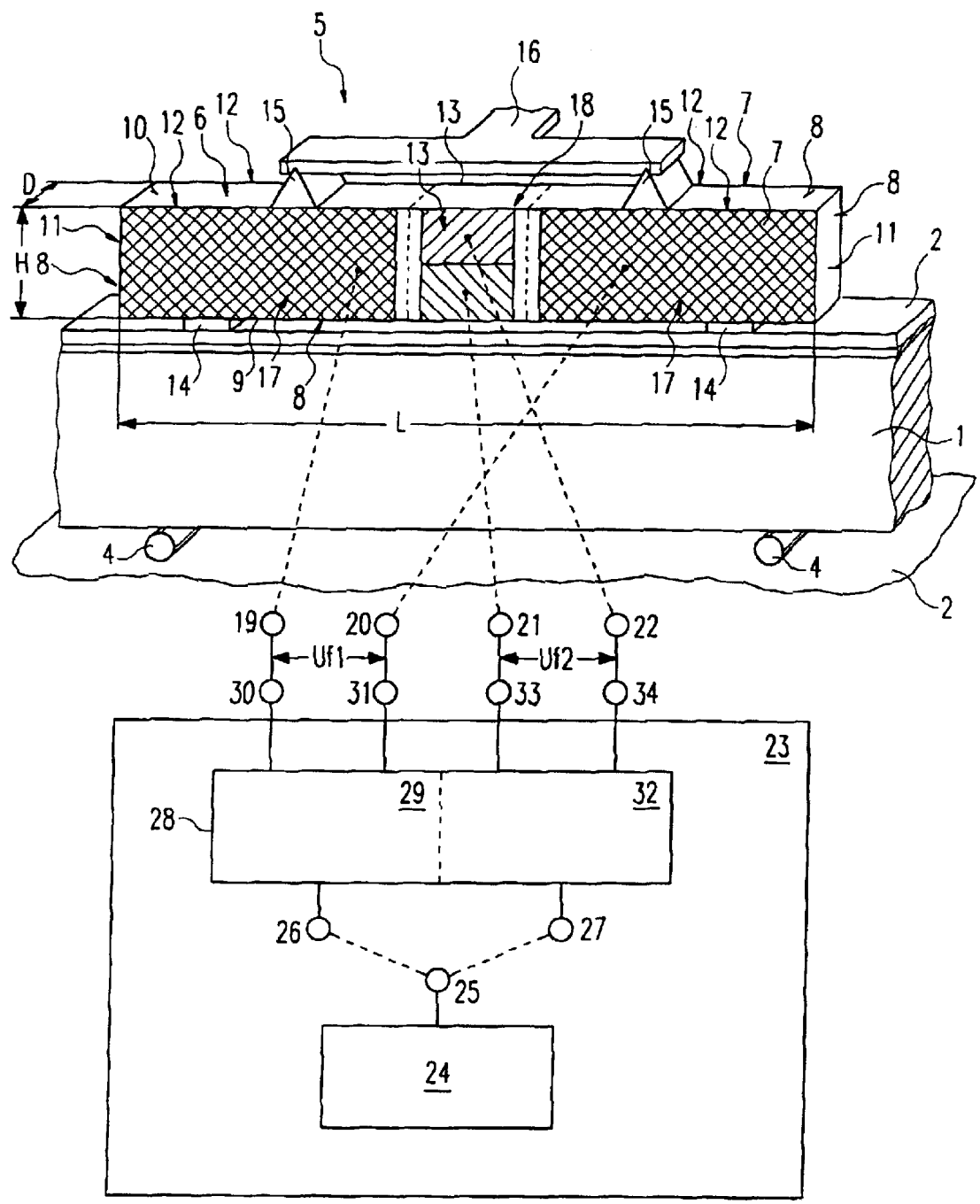

The invention relates to a piezoelectric drive, in particular for the generation of rotational and translational movements which can be carried out continuously or stepwise.

The inventive motor can be employed in automation systems, in robot technology, as a drive for microscope tables, for fine-positioning of various types of coordinate tables, in optical and laser systems, as well as in numerous other devices in which translational movements with high precision accuracy are required.

Piezoelectric motors or drives which are based on the utilisation of acoustic transducer travelling waves have been known for a longer period, with reference being made here for example to EP 0 475 752 and U.S. Pat. No. 5,596,241. Such motors, however, have the drawback that it is not possible to manufacture them as miniature drives, because the minimum length of the waveguide of these motors must be a multiple of $6\lambda$ to $10\lambda$. In addition, the manufacture is complicated and expensive.

Linear piezoelectric motors which utilise standing acoustic waves are also known, e.g. from U.S. Pat. No. 5,453,653.

Such motors are relatively small and their manufacture is simple. A monolithic plate-shaped piezoelectric oscillator with a long and a short side and with a friction element which is arranged on one of its small surfaces is used as the drive element in such motors.

One of the large surfaces of the piezoelectric oscillator carries a first and a second electrode group. On the second one of the oscillator surfaces a continuous electrode is arranged. Each of the first and the second electrode group represents two equally sized diagonally arranged rectangular areas of the metallised piezoelectric ceramic surface. The source of the electric excitation of acoustic oscillations directs the voltage to the continuous electrode and to the first or second electrode group.

Due to the asymmetric configuration of each of the electrode groups with respect to the longitudinal axis of the oscillator the electric source voltage generates an asymmetric deformation in the oscillator plate. This results in the friction element performing a movement on a closed path. Depending on which electrode group the electric voltage is applied, the friction element moves in a forward direction or in the opposite direction. The moving friction element causes a movement of the pressed-on element. The operating frequency of the motor is in the vicinity of the resonance frequency of the second oscillation mode of the flexural oscillations of the oscillator along the oscillator length.

It is disadvantageous with such motors that an asymmetric deformation of the oscillator plate is required for the generation of acoustic oscillations. Such a motor has trajectories which differ substantially from points on the function face of the oscillator. This leads to a substantial difference in the tangential components of the oscillation velocities of these points. The latter causes instability of the movement velocity of the driven element, which is highly dependent on the real contact site of the surface of the driven element with the function face of the driven element.

Moreover, a great difference in the tangential components of the oscillation velocities causes different degrees of wear of the function face of the friction element. This renders the motor operation instable over a longer operating period.

With velocities above 0.1 m/s the non-uniformity of the movement velocity of the driven element of known motors reaches approx. 50%. With lower movement velocities, i.e. below 0.01 m/s, the inaccuracy amounts to 80% and more. Such a non-uniformity limits the application range of the motors and complicates the construction of electronic velocity stabilisers, in particular for the range of very small velocities.

Moreover, high exciter voltages are required for such motors.

The construction of a motor according to U.S. Pat. No. 5,453,653 comprises only one friction element on the surface of the piezoelectric oscillator. This renders the oscillator mechanically instable which, with high movement velocities of the driven element, reduces the positioning precision and leads to complicated constructions.

Moreover, the use of only one friction element limits the maximum possible force developed by the motor with only one piezoelectric oscillator. In known motors, this force amounts to approx. 10 N which is insufficient for many applications. The use of several oscillators combined to one packet in turn limits the positioning precision of the driven element.

It is therefore the object of the invention to specify a piezoelectric drive or motor, respectively, which comprises a uniform movement velocity of the driven element at high and low velocities, which has a higher operating stability over a longer operating period of the motor, requires a low excitation voltage, develops a high force, has a stable oscillator construction, and comprises a means or device for tracking the oscillator resonance frequency.

The solution of the object is achieved with a subject as is described in the valid main claim, with the dependent claims comprising at least suitable embodiments and developments.

According to the invention the first and the second electrode group represent two areas of identical configuration which are located on the two large opposite metallised surfaces of the plate-shaped piezoelectric transducer or oscillator (of the piezoelectric plate). Each of the two electrode groups forms at least one independent generator of non-connected acoustic standing waves which propagate along the long side of the piezoelectric oscillator or of the plate, respectively. The first electrode group forms a longitudinal wave generator and the second one a flexural wave generator of acoustic waves. The source of the electric excitation of acoustic oscillations comes from a basic generator which is electrically connected with signal inputs of a two-channel power amplifier. Each output of the two-channel power amplifier is electrically connected with the corresponding electrode groups.

Due to the fact that with the proposed motor the first electrode group forms at least one independent generator of standing acoustic longitudinal waves and the second one forms at least one independent generator of standing acoustic flexural waves and that these are designed in such a manner that no connection exists between them, i.e. that the waves produced by the generators do not influence each other, the waves propagating in the piezoelectric oscillator are pure longitudinal and pure flexural waves.

Such waves lead to pure elliptic trajectories of the oscillator body and have virtually an identical shape with hardly differing amplitudes in the areas of the defined maxima of standing flexural waves.

This enables a movement of the points in these areas on the function faces of the friction elements with virtually the same velocity. All of these elements together therefore enable a considerable increase in stability both with low and high movement velocities of the driven element.

The configuration of the electrode groups is realised in such a manner that the generators of acoustic longitudinal and flexural waves fill the entire volume of the piezoelectric plate. This reduces the exciter voltage in an advantageous manner.

With the proposed motor the first electrode group represents rectangular areas of the metallised surface of the plate-shaped oscillator. Here, the height is equal to the width. In between a unidirectionally polarised piezoelectric ceramic is disposed in a normal (vertical) direction relative to the electrodes. The electrodes are located at the sites of oscillation velocity nodes of the standing acoustic longitudinal wave which propagates in the oscillator. Such an electrode construction which forms a generator of acoustic longitudinal waves enables the generation of pure longitudinal waves in the oscillator plate.

The second electrode group also represents a rectangular area of the metallised surface of the plate-shaped piezoelectric oscillator. The height is again equal to the width. In between a unidirectionally polarised piezoelectric ceramic is disposed in the normal direction (i.e. vertically to the electrodes). The electrodes are again located at the sites of oscillation velocity maxima of the standing acoustic flexural wave which propagates in the oscillator and have insulating areas or spacings along their longitudinal axes.

Such an electrode construction allows the generation of pure flexural waves.

In a further embodiment of the proposed drive t he second electrode group represents rectangular areas of the metallised surface of the plate-shaped piezoelectric oscillator, with the height being equal to the width and with a heterodirectionally and with respect to the longitudinal axis of the oscillator symmetrically polarised piezoelectric ceramic being arranged in a normal direction between these areas or at the sites, respectively, of oscillation velocity maxima of the standing acoustic flexural waves which propagate in the oscillator.

Such an electrode construction enables the design of the generator electrodes of the acoustic flexural wave without insulating spacings in between, which increases their efficiency.

With the inventive solution of the drive the friction elements are formed as thin strips of a hard abrasion-resistant substance, e.g. oxide ceramic, metal ceramic, or of a combination with other materials. The friction elements are located in areas of oscillation velocity maxima of the acoustic flexural wave which propagates in the plate-shaped piezoelectric oscillator or in the oscillator plate, respectively.

Such an embodiment leads to a homogeneity of the tangential component of the oscillation velocity on the function face.

In a further version of the motor the friction elements are arranged on a smaller lower surface of the plate-shaped piezoelectric oscillator. This design version of the motors permits the application of several friction elements whereby the force generated by the motor or the force transmission, respectively, can be improved. In a supplementary construction version of the motor a friction element is arranged on the small lateral surface of the plate-shaped piezoelectric oscillator.

With this, a maximum possible velocity of the driven element is achieved.

The friction elements of the motor may have a two-layer structure.

The first layer of this structure is made from a hard abrasion-resistant material with a high friction factor compared to the friction layer of the driven element. The second layer consists of a hard porous material.

Both layers are joined by bonding in the sintering process. In the interface area of the first and the second layer a so-called transition layer may be formed.

With this design version of the motor a combination of the temperature co efficient differences of the piezoelectric ceramic and the material of the friction element is possible, and an increase in strength of the bonded joint of the friction element with the piezoelectric ceramic surface can be achieved.

The friction elements may be joined by means of a special bonding agent with the surface of the piezoelectric oscillator with the bonding agent chemically reacting both with the piezoelectric ceramic and with the material of the friction element by means of a low-melting lead-containing glass.

With the proposed drive the friction elements can also be formed by glass strips which are fused onto the surface of the plate-shaped piezoelectric oscillator. The glass is blended with a powder of a hard, wear-resistant material, e.g. aluminium oxide, zirconium oxide, silicon carbide, titanium carbide, or similar materials or their mixtures. The strips are located at the sites of defined maxima of the oscillation velocities of the acoustic flexural wave. With this design version a maximum possible friction factor in the friction element and the friction layer of the driven element is achieved.

In the described drive the monolithic plate is equipped with at least one fixing element in order to mechanically fasten the plate.

In the various design versions these fixing elements may be designed as rectangular, triangular, semi-cylindrical prisms, as conical, pyramid-shaped, semi-spherical elements, or in the form of rectangular elements with profile grooves or as round elements, respectively, with profile holes. The elements are located at the sites of oscillation nodes of the standing acoustic longitudinal wave which propagates in the oscillator and are rigidly connected with its surface. Thereby, a high positioning precision is achieved. The fixing elements can be made from such materials whose modulus of elasticity is approximately identical with or slightly higher than the modulus of elasticity of the piezoelectric ceramic of the plate-shaped piezoelectric oscillator. Thereby a high overall strength is achieved.

The fixing elements can also be made from materials whose modulus of elasticity is much smaller than the modulus of elasticity of the piezoelectric ceramic. This reduces the force resulting from the acoustic oscillator oscillations between the fixing elements and the surface of the piezoelectric oscillator.

In a version of the motor the fixing elements and the plate-shaped piezoelectric transducer can be manufactured from the same type of piezoelectric ceramic.

There is also the possibility to manufacture the fixing elements or parts of same from porous oxide ceramic or another porous material, which enables a good bonded joint of the fixing element with the surface of the piezoelectric plate.

With the claimed drive the fixing elements can also be designed as bending resonance plates. With this design the damping introduced by the fixing elements into the resonance system of the piezoelectric plate becomes minimal so that the energy losses in the piezoelectric oscillator can be reduced.

The fixing elements can be joined with the piezoelectric ceramic surface by means of an organic adhesive. This allows the use of materials with different temperature coefficients.

In a further embodiment of the drive the friction layer of the driven element is made in the form of a ceramic oxide layer with a thickness which is at least five times smaller than half of the wave length of the acoustic standing longitudinal wave which propagates in the oscillator. This can suppress undesired oscillations.

In a further version the body thickness of the driven element located below the friction layer is greater than half of the wave length of the standing acoustic flexural wave which propagates in the oscillator. In this case the generation of an acoustic flexural wave in the body of the driven element is nearly completely precluded.

Likewise, it is possible to arrange a damping layer between the body of the driven element and its friction layer, which is manufactured from organic materials or hard porous materials or combinations of such substances, respectively. This reduces the acoustic coupling and eliminates a thermal incompatibility due to different expansion coefficients of the friction layer and the driven element.

According to the invention the driven element may be designed in the form of a bar with a rectangular, polygonal, or round cross-section. It can, however, also be formed as a tube.

The driven element can also be formed from a hard material in the shape of a bar with a rectangular cross-section, in the body of which damping grooves are formed at periodic spacings.

If the driven element is manufactured from a hard porous material the longitudinal waves developing in the body of this element are dampened in an advantageous manner. Likewise, the pores of the driven element can be filled with a sound-absorbing filler material so that damping of both the longitudinal and the flexural waves is effected.

A further constructive version of the motor includes at least two plate-shaped piezoelectric oscillators or transducers which are arranged opposite each other and lie in one plane, with these having at least two friction layers which are parallel to each other and which are located on the two opposite sides. Here, a support bearing can be omitted.

The use of at least three plate-shaped transducers or at least three friction layers which are parallel to each other and lie in at least three planes is also conceivable. Here, the driven element is very stable in the plane perpendicular to its longitudinal axis.

In an embodiment of the motor the driven element is designed as a rotating body. It is also conceivable to arrange the fixing elements of the piezoelectric transducers in a stationary girder.

Another version with respect to construction is to arrange or place the fixing elements of the plate-shaped piezoelectric oscillator or transducer in a flat spring-type girder whereby transverse displacements of the driven element can be compensated and thus an increase in the uniformity of the movement be effected.

With respect to the control side the output of a basic generator is connected with one of the signal inputs of a two-channel power amplifier via a phase shifter. Thereby, the shape of the trajectories of points of the working surface of the friction elements can be optimally adjusted.

In a further circuit engineering version each channel of the two-channel power amplifier is formed as a bridge power amplifier with two half-bridge amplifiers and two exciter channels including phase controllers. Thereby, an electronic control of the movement velocity of the driven element can be effected.

In addition, it is possible to provide a signal level transducer and a zero signal detector with respect to the control signal in order to drive the motor with a unipolar voltage.

The piezoelectric transducer, i.e. the plate-shaped oscillator can be provided with a sensor for the detection of the longitudinal component of mechanical stresses. This sensor is disposed in one of the velocity nodes of the longitudinal wave which propagates in the plate-shaped piezoelectric oscillator. Thereby, longitudinal stresses can be determined and thus the oscillation velocity of the longitudinal wave which propagates in the oscillator be determined.

In addition, the plate-shaped piezoelectric transducer can be provided with a sensor for determining the bending component of the mechanical stresses. This sensor is located in one of the oscillation velocity maxima of the flexural wave which propagates in the transducer.

The generator, i.e. the source of the electric excitation of acoustic oscillations can be equipped with a phase detector for determining the signal originating from the sensor of components of mechanical stresses. The phase detector includes support and phase measuring inputs and an output, with the basic generator having an input for the electric frequency control. The support input of the phase detector is electrically connected with one of the electrode groups. The measuring input of the phase detector is electrically connected with the sensor for determining the mechanical stresses. The output of the phase detector is electrically connected with the input for the electrical control of the excitation frequency of the basic generator. With such a circuit arrangement an exact tracking of the mechanical resonance frequency of one of the oscillation types of the piezoelectric transducer can be effected in order to further'stabilise the motor operation.

The invention will be explained in more detail hereinafter with reference to embodiments as well as by means of figures.

FIG. 1 shows a general illustration of the drive with a ⅖ mode oscillator.

The drive includes the driven element 1 with the friction layer 2 located thereon and the driving element 5. The driven element 1 is arranged on a housing 3 and bearings 4.

The driving element 5 consists of a monolithic plate-shaped piezoelectric oscillator or transducer 6 of a thickness D and a length L. D and L are unequal to the thickness H.

The driving element 5 includes two large surfaces 7 and four small surfaces 8 which consist of small lower surfaces 9, small upper surfaces 10, and two small lateral surfaces 11.

First 12 and second 13 electrode groups are disposed on the large surfaces 7. In the illustrated example two friction elements 14 are arranged on the lower surface 9. Two fixing elements 15 are located on the upper surface 10.

The friction elements 14 are in an elastic frictional contact with the friction layer 2 of the driven element 1.

The elements 15 are located in their position by means of a pressure device 16 with respect to the housing 3.

The first electrode group 12 forms two co-phasal generators 17 of standing acoustic longitudinal waves which propagate along the length L of the piezoelectric oscillator 6.

The second electrode group 13 forms a generator 18 of standing acoustic flexural waves which propagate along the length L of the piezoelectric oscillator.

In FIG. 1 and in further figures the generators 17 and 18 are defined against each other by a broken line. Each of the electrode groups 12 and 13 has electrical connections 19, 20 or 21, 22, respectively.

Under circuit engineering aspects, a source 23 for the generation of oscillations and a basic generator 24 are provided. The output 25 of the basic generator 24 is electrically connected with the signal inputs 26 and 27 of a two-channel power amplifier 28. The first channel 29 of the power amplifier 28 has a non-inverting output 30 and an inverting output 31. The second channel of the power amplifier 28 comprises the non-inverting output 33 and the inverting output 34.

The first channel 29 generates the voltage Uf1 at its outputs 30 and 31. The second channel generates the voltage Uf2 at its outputs 33 and 34.

Figure 2:
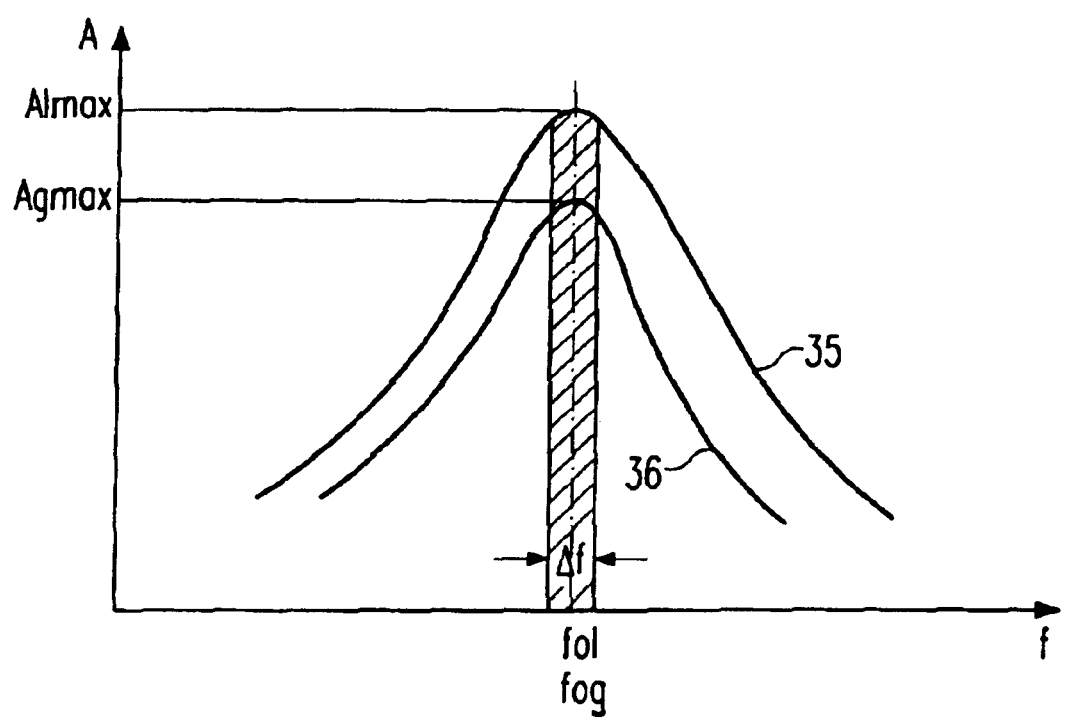

FIG. 2 shows the position of the resonance curves of the plate-shaped transducer 6 on the frequency scale f, where A deformation amplitude of the oscillator Almax maximum amplitude of the longitudinal deformations;

Agmax maximum amplitude of the bending deformations;

f0l and f0g resonance frequencies of the longitudinal and flexural oscillations;

Δf frequency band which corresponds to the acceptable difference of resonance frequencies of the oscillator 6;

Curve 35 resonance characteristic of longitudinal oscillations of the oscillator 6;

Curve 36 resonance characteristic of flexural oscillations of the oscillator 6.

Figure 3:
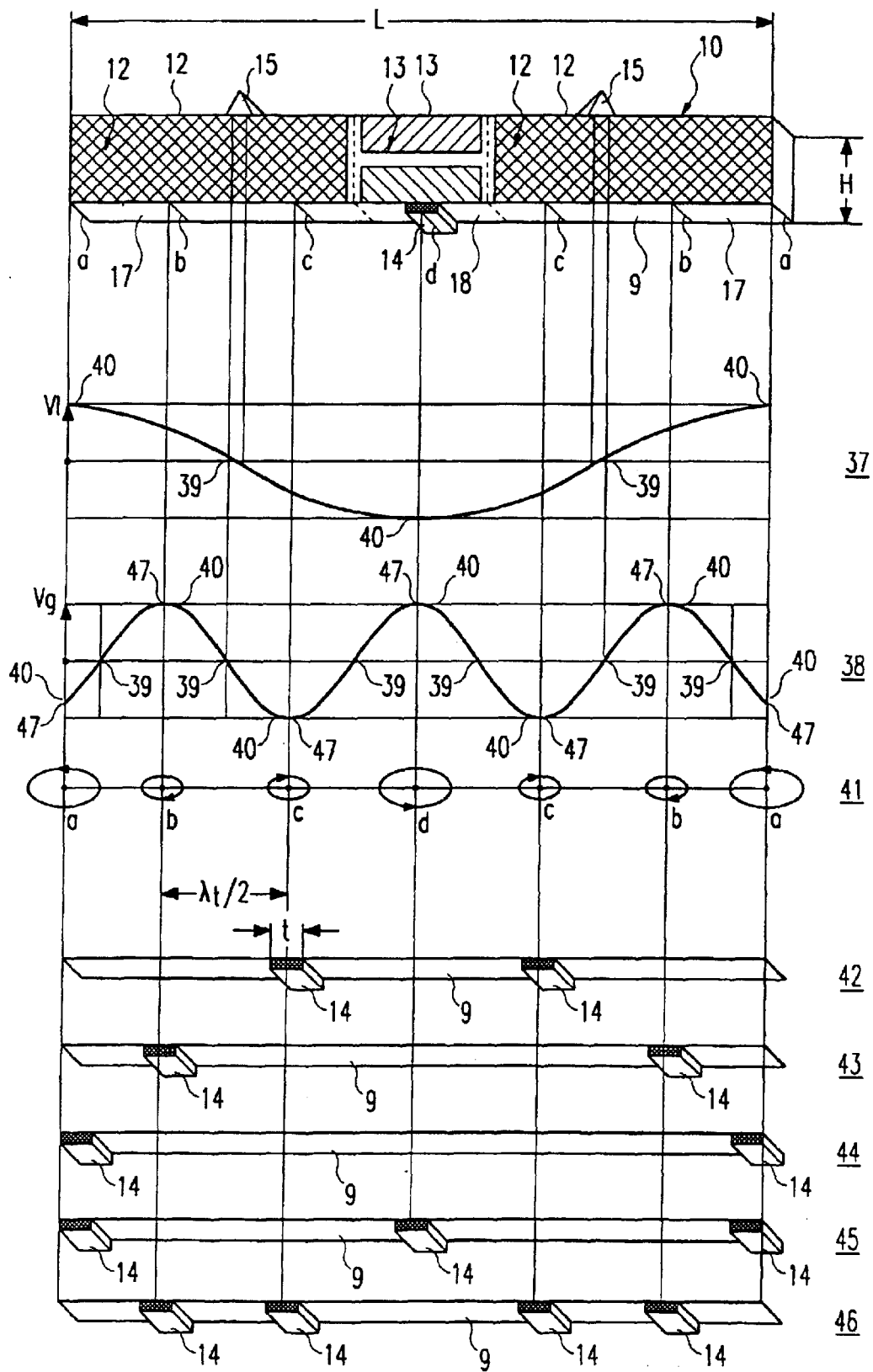

FIG. 3 shows a piezo transducer according to a ⅖ mode oscillator and includes diagrams of the distribution of oscillation velocities Vl (position 37) and Vg (position 38) along its length L on the upper 9 and the lower 10 oscillator surfaces. The diagrams of the distribution of oscillation velocities 37 and 38 also include the oscillation velocity nodes 39 and the oscillation velocity antinodes or maxima 40.

At position 41 of FIG. 3 trajectories of points are shown which lie along the line a, b, c, d. These correspond to oscillation velocity maxima of the flexural wave originating in the oscillator 6.

At the positions 42, 43, 44, 45, 46 the possible locations of the friction elements 14 located on the lower surface 9 are shown. The friction elements are disposed in the areas of the defined maxima 47 of oscillation velocities of the standing acoustic flexural wave which propagates in the oscillator 6.

There, the elliptic trajectories of the points have the same sense of rotation on the upper oscillator surface 10 two fixing elements 15 are mounted which are located in the areas of nodes 39 of the standing acoustic longitudinal wave.

FIGS. 4 to 8 show possible configurations of the first 12 and the second 13 electrode groups. FIGS. 4 to 8 also show the schematics of electrical connections of the electrodes within each electrode group as well as the polarisation direction of the piezoelectric ceramic between the electrodes for a ⅖ mode oscillator 6.

Figure 4:
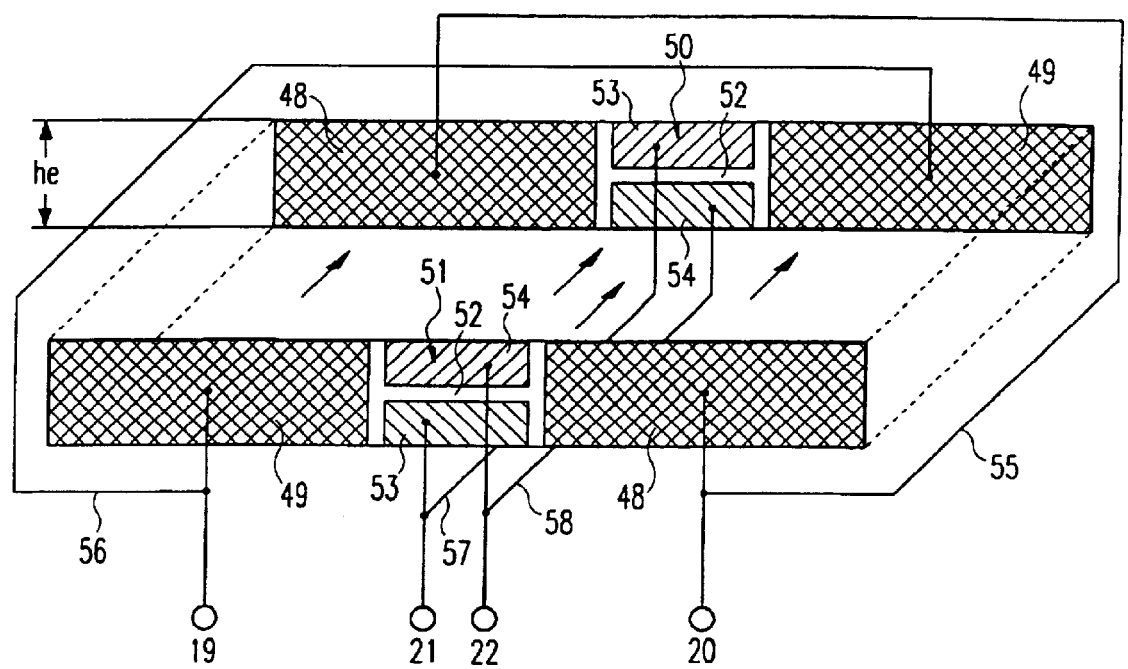

The configuration of the electrode group 12 shown in FIG. 4 is formed by the electrodes 48 and 49, with the second electrode group 13 comprising the electrodes 50 and 51.

The height he of the electrodes 48, 49 and 50, 51 is approximately equal to the width H of the plate-shaped piezoelectric transducer 6.

The electrodes 50 and 51 of the second electrode group 13 include the insulating intermediate areas 52. These are arranged along the longitudinal axis of the oscillator 6 and divide the electrodes into two equal parts 53 and 54. With this version of the electrode configuration the piezoelectric ceramic of the oscillator 6 is polarised homogeneously perpendicular to the electrode (in normal direction).

In FIG. 4 the polarisation is symbolised by arrows. The electrodes 48, 49 and 50, 51 as well as their parts 53 and 54 are connected by means of the conductors 55, 56 and 57, 58.

The oscillator 6 with the configuration of electrode groups shown in FIG. 4 and their connection schematics comprises two longitudinal wave generators 17 and one flexural wave generator 18. The longitudinal wave generator 17 is formed by the electrodes 48 and 49 of the first electrode group 12, and the flexural wave generator 18 is formed by the electrodes 50, 51 of the second electrode group 13.

The electrodes 48, 49 and the generators formed by them are arranged in such a manner that they are located in the areas of the oscillation velocity nodes 39 of the developing standing acoustical longitudinal wave which propagates in the oscillator 6 (see FIG. 3).

The electrodes 50, 51 and thus the generators 18 are arranged in such a manner that they are located in the areas of the oscillation velocity maxima 40 of standing acoustic flexural waves which propagate in the oscillator 6 (see also FIG. 3).

Figure 5:
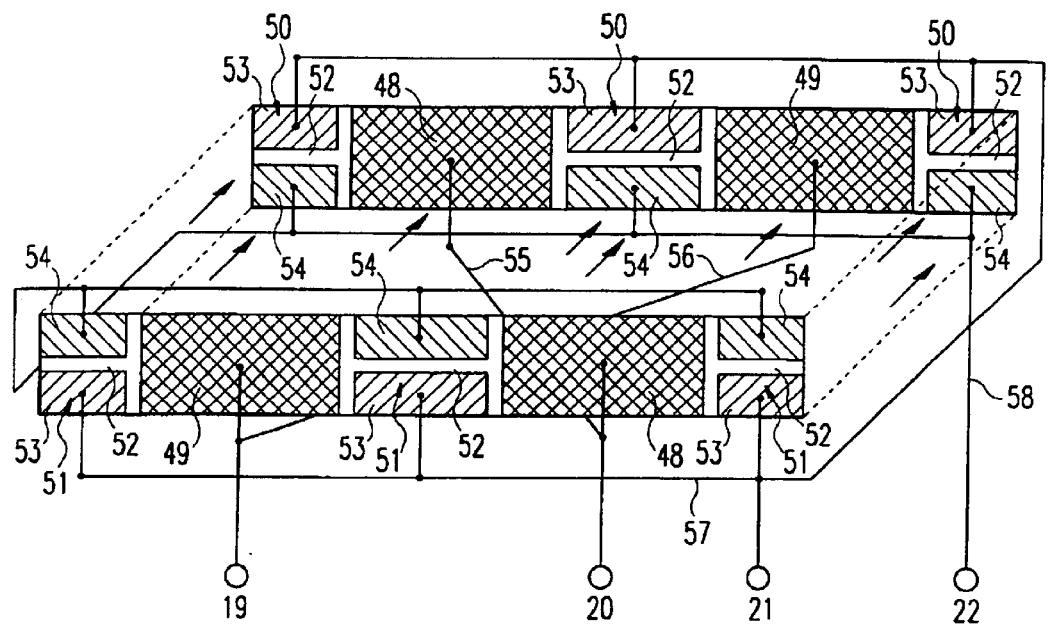

The oscillator 6 with the configuration shown in FIG. 5 has two longitudinal wave generators 17 and three flexural wave generators 18.

The generators 17 are formed by the opposite electrodes 48, 49 and the generators 18 are formed by the opposite electrodes 50, 51.

Figure 6:
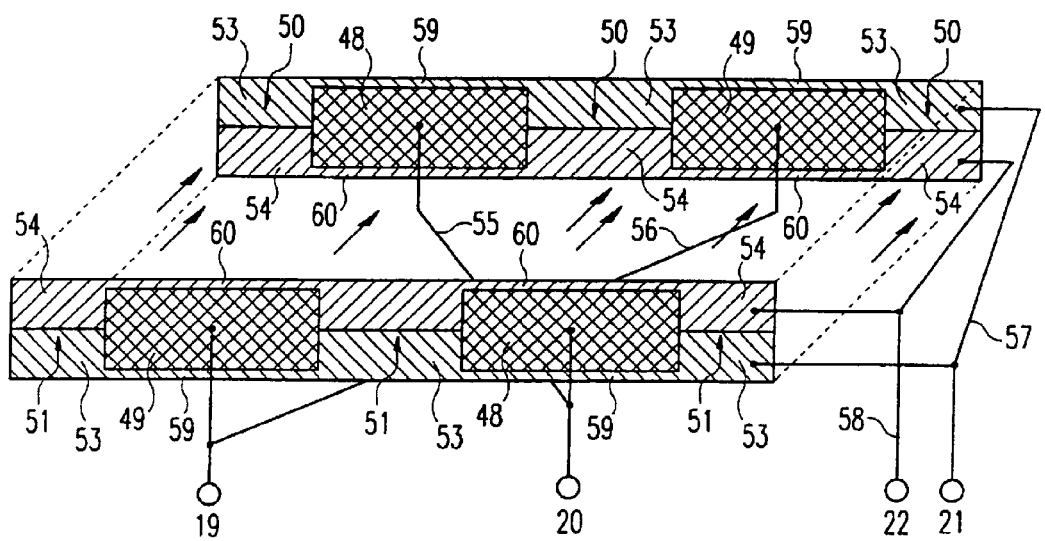

The oscillator 6 must have a defined unidirectional polarisation of the piezoelectric ceramic disposed between the electrodes as symbolised in FIG. 6 by means of arrows.

In the configuration of electrodes groups shown in FIG. 6 and differing from the solution according to FIG. 5, parts of the lines connecting the electrodes 53 and 54 are formed as thin current conducting strips 59, 60 on the surface of the oscillator 6.

Figure 7:
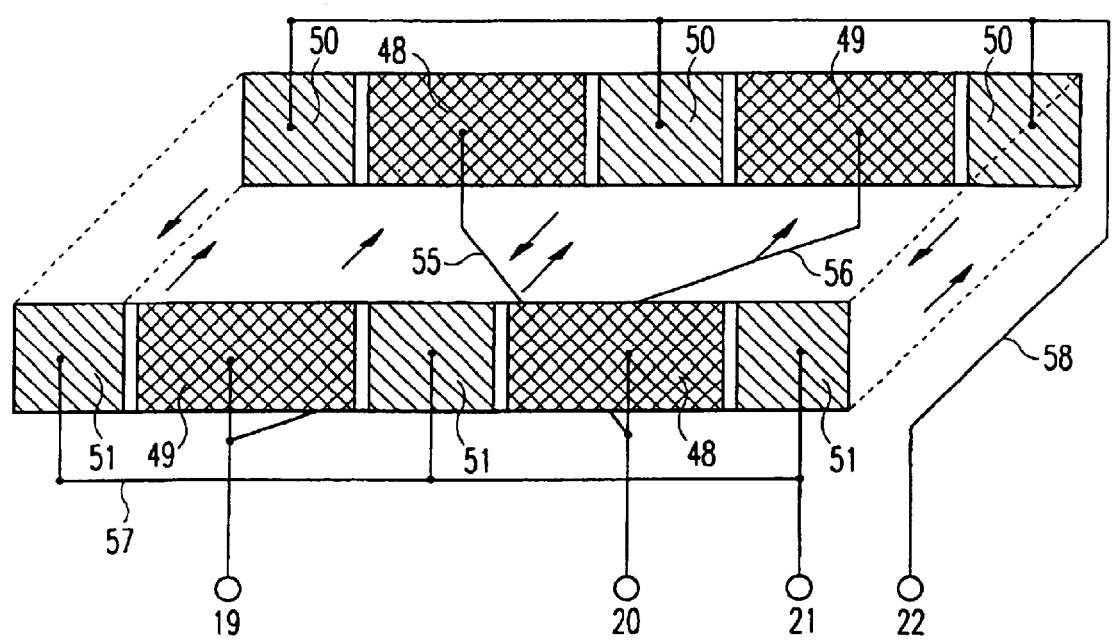

The version of an electrode group configuration illustrated in FIG. 7 has a polarisation realised in various directions of the piezoelectric ceramic located between the electrodes So and 51 of the second electrode group 13. Here, the piezoelectric ceramic is polarised in the normal direction to the electrode surface 50, 51 and in the opposite direction with respect to the longitudinal axis of the oscillator, as is shown in detail in FIG. 7.

Figure 8:
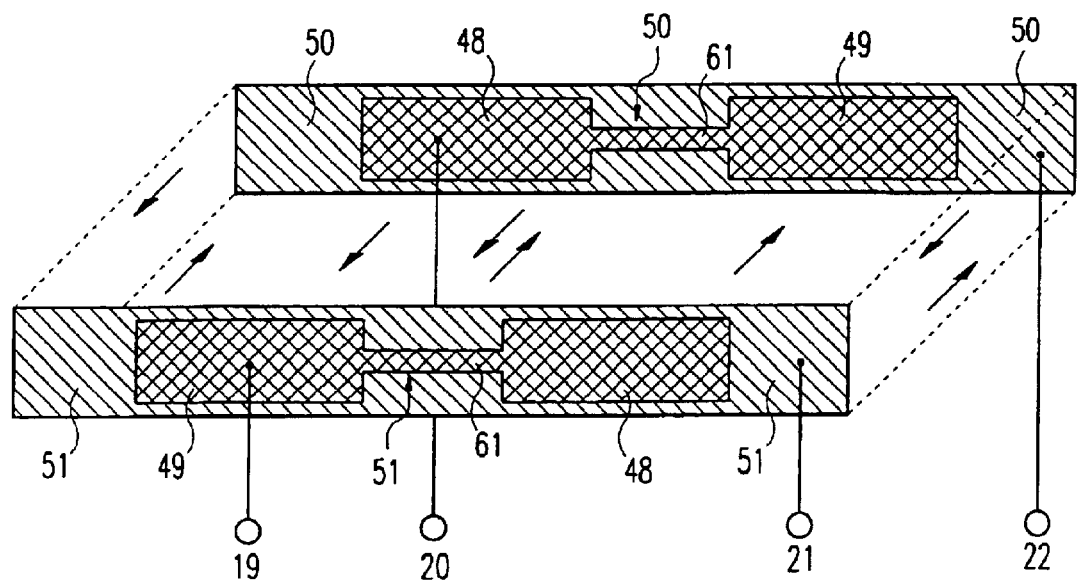

In the version of the electrode group configuration shown in FIG. 8 a piezoelectric ceramic polarised in various directions is additionally provided in each of the two basic generators 17 for the generation of acoustic longitudinal waves, which is disposed between the electrodes 48 and 49 of the first electrode group 12. This makes it possible to connect the electrodes 48 and 49 on each of the large oscillator surfaces by means of current conducting strips 61.

Figure 9:
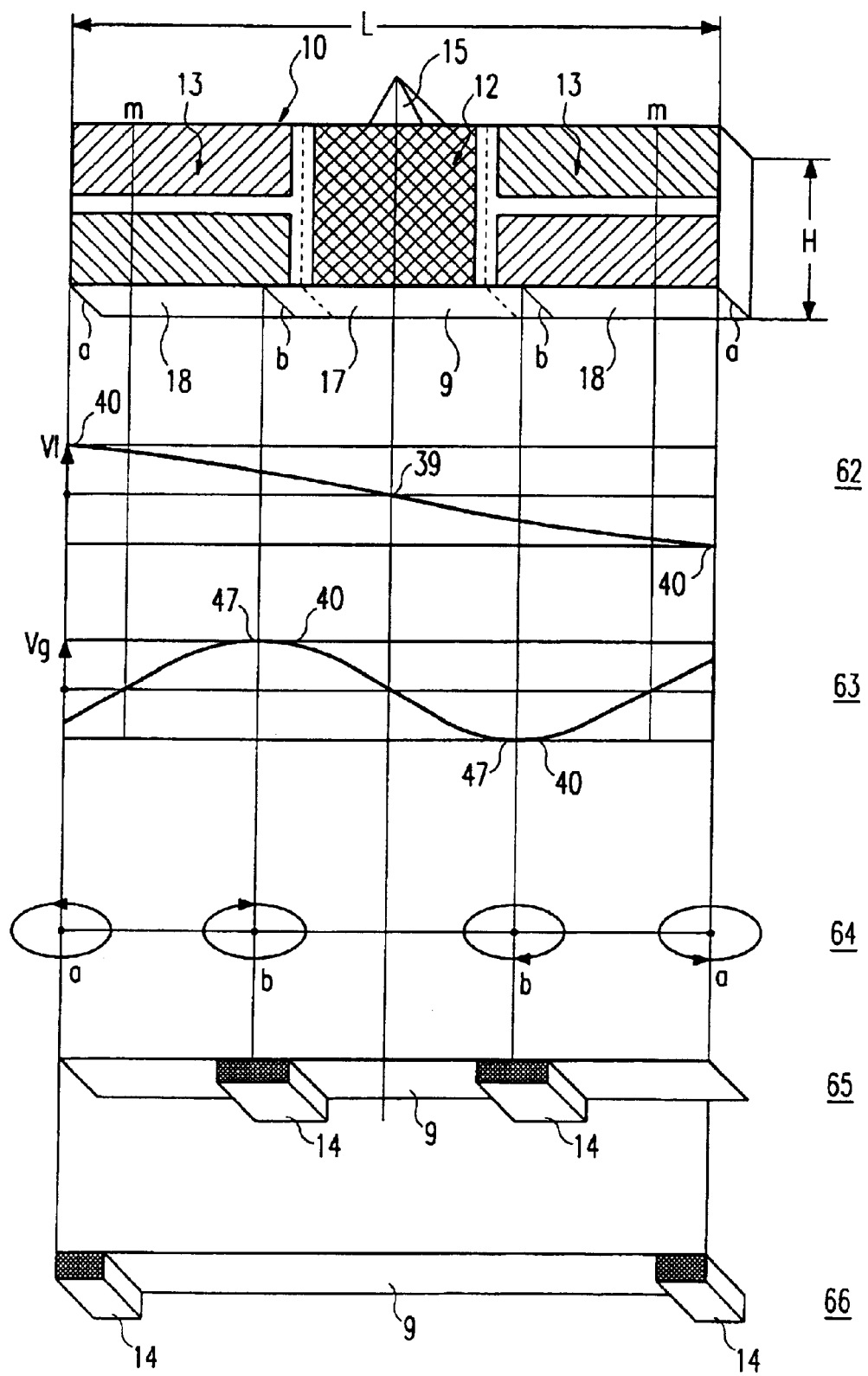

FIG. 9 shows a ½ mode oscillator 6 of the longitudinal type. It comprises one longitudinal wave generator 17 and two flexural wave generators 18. The two generators are defined against each other in the figure by the broken lines which can be seen therein.

The positions 62 and 63 show diagrams of the distribution of oscillation velocities Vl, Vg along the oscillator length L and along the lower 9 and the upper 10 of the oscillator surfaces. In the position 64 the trajectories of points are illustrated which lie along the lines a and b. These lines correspond to the maxima 47 of oscillation velocities of the flexural wave which propagates in the oscillator 6. The positions 65 and 66 show possible locations of the friction elements 14 on the lower surface 9 of the oscillator 6. In this design version, the fixing element 15 is located in the centre of the upper surface 10 of the oscillator 6. The nodes 39 of longitudinal and flexural wave also develop there. With this design version it is also possible to arrange the fixing elements 15 at the sites of two outer nodes of the flexural wave, i.e. along the line m. In this case, however, the fixing elements must be free to move in the longitudinal direction.

Figure 10:
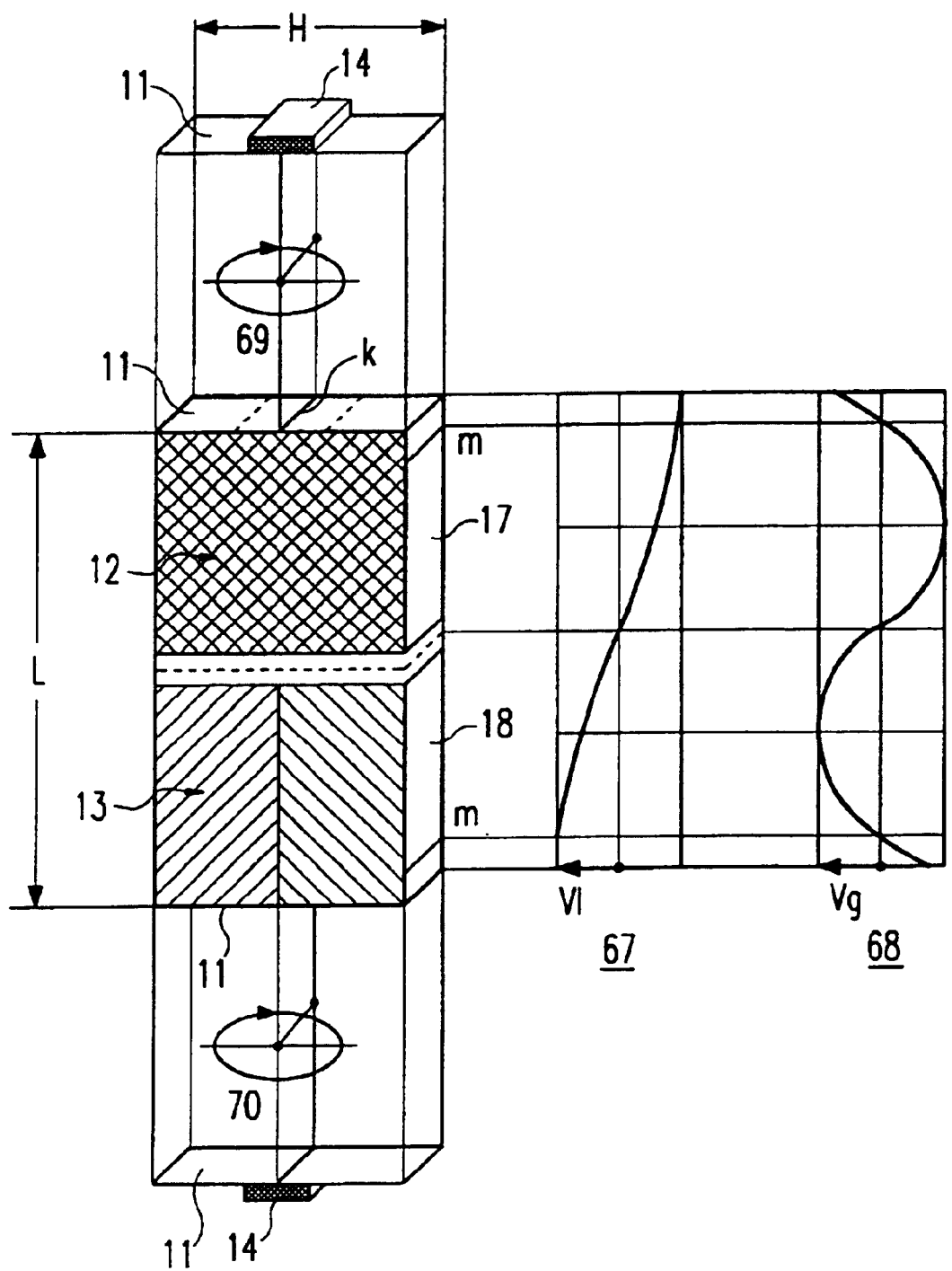

FIG. 10 shows a plate-shaped ½ mode oscillator 6 of the transverse type. It comprises one longitudinal wave generator 17 and one flexural wave generator 18. The positions 67 and 68 are diagrams of the distribution of oscillation velocities Vl and Vg along the oscillator length L. The positions 67 and 68 also illustrate the trajectories of points on the centre line k of the lateral surfaces 11 of the oscillator 6. The oscillator of the transverse type shown in FIG. 10 differs from the ½ mode oscillator of the longitudinal type in that the friction element 14 is fastened on one of its lateral surfaces 11. The fixing elements 15in such a design version of the oscillator 6 are arranged either in the centre of the lower 9 and the upper 10 of the oscillator surfaces or on the surfaces along the lines M in the areas of two outer nodes of the standing acoustic flexural wave.

FIGS. 11 to 15 illustrate configuration versions of electrode groups and polarisation directions of the ½ mode oscillator. Such design versions may be employed both for oscillators of the longitudinal type and for those of the transverse type.

Figure 11:
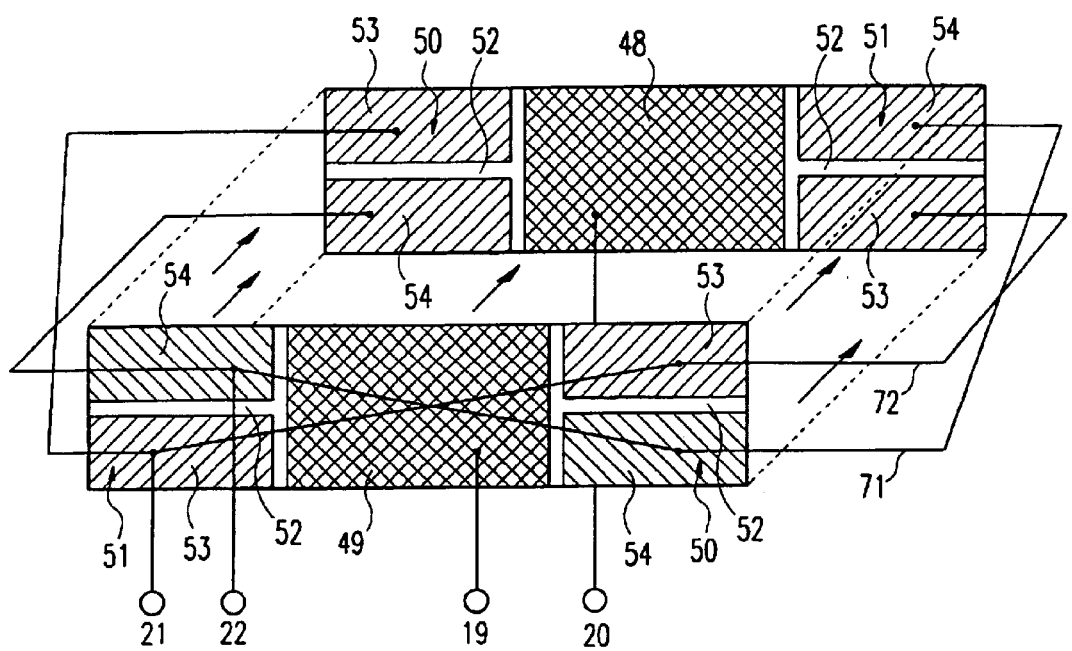

The oscillator according to FIG. 11 has two flexural wave generators 18 and one longitudinal wave generator 17 (see also FIG. 9). These generators are formed by the two electrode groups 12, 13. They also include the electrodes 50, 51 and 48, 49. The electrodes 50, 51 are divided into two parts 53, 54 by insulating intermediate areas 52. The equivalent parts 53, 54 of the electrodes 50, 51 are connected with each other by means of conductors 71, 72. The oscillator 6 with the electrode group configurations illustrated in FIG. 11 has a uni-directional polarisation of the piezoelectric ceramic in a normal direction to the electrodes as is symbolised by the arrows.

Figure 12:
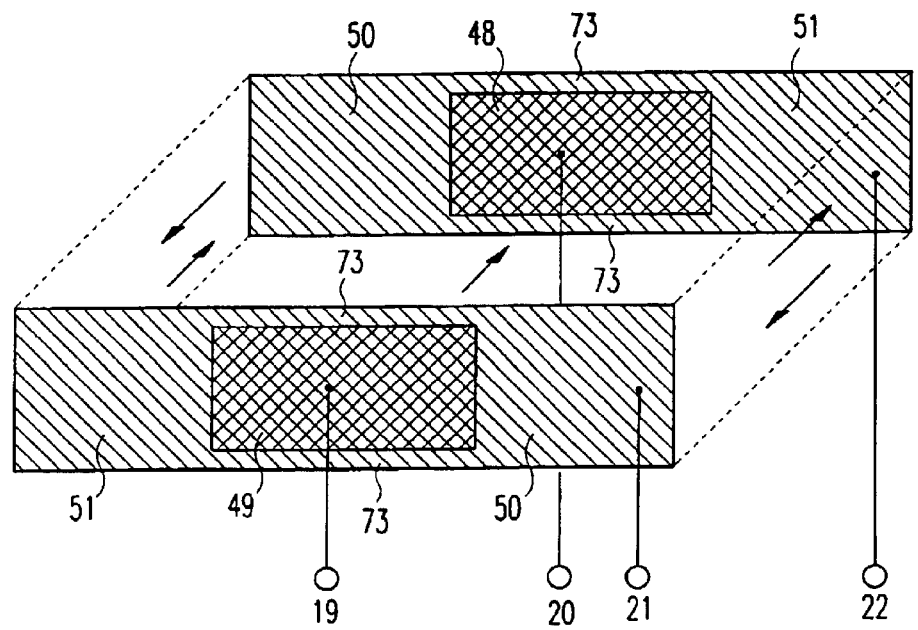

The oscillator with the electrode group configuration shown in FIG. 12 has also two flexural wave generators 18 and one longitudinal wave generator 17 as is shown in FIGS. 9 and 11. The generators 18, 17 are formed by the electrodes 50, 51 and 48, 49. The electrodes 50 and 51 arranged on one side of the oscillator 6 are connected by means of thin current conducting strips 73. In contrast to the above mentioned version, the oscillator 6 must have a bi-directional polarisation in the normal direction to the electrode of the piezoelectric ceramic disposed between the electrodes 50 and 51 as is symbolised by the arrows.

Figure 13:
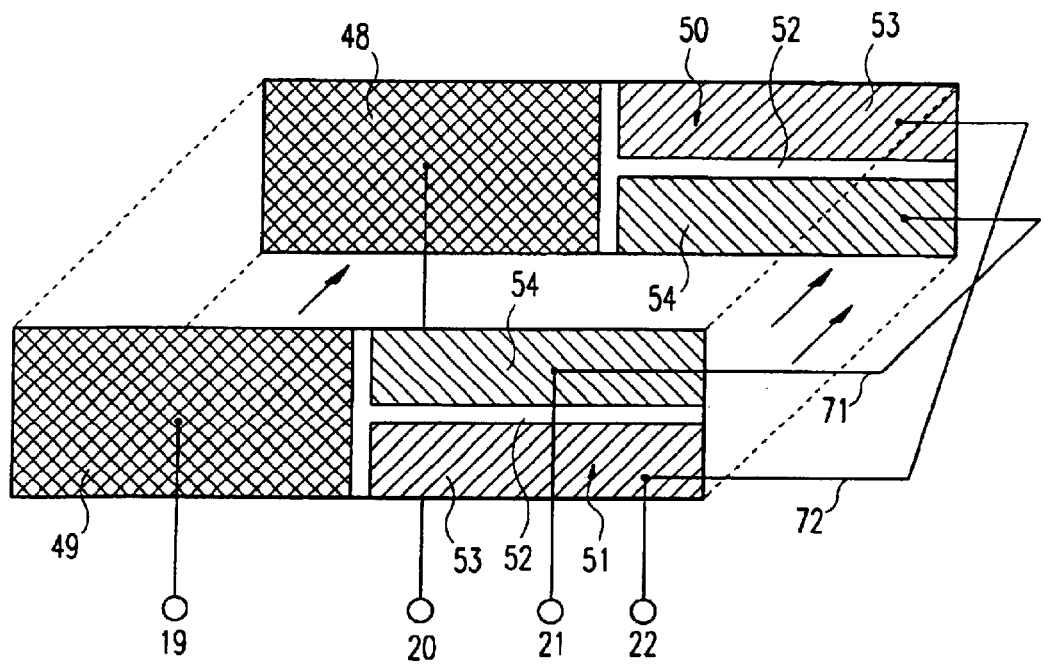
Figure 14:
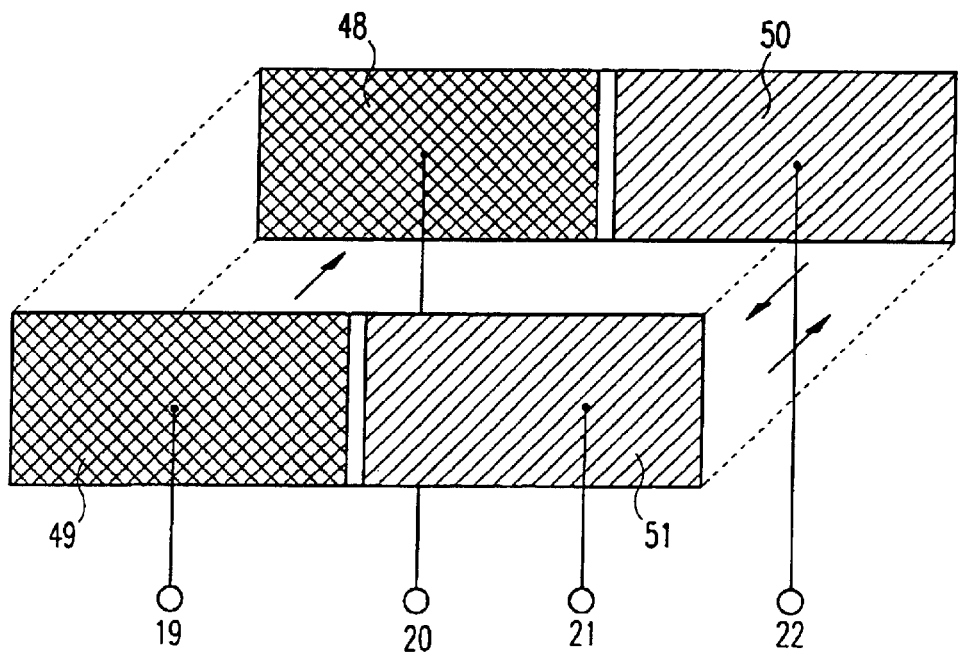

The oscillator according to FIG. 13 has one longitudinal wave generator 17 and one flexural wave generator 18 (see also FIG. 10). The oscillator according to FIG. 14 is constructed analogously to the previous one, but differs from it in that it comprises a bi-directional polarisation in the normal direction to the electrodes 50 and 51 of the piezoelectric ceramic disposed between the electrodes of the second electrode group 13. These form a generator 18 for standing acoustic flexural waves.

Figure 15:
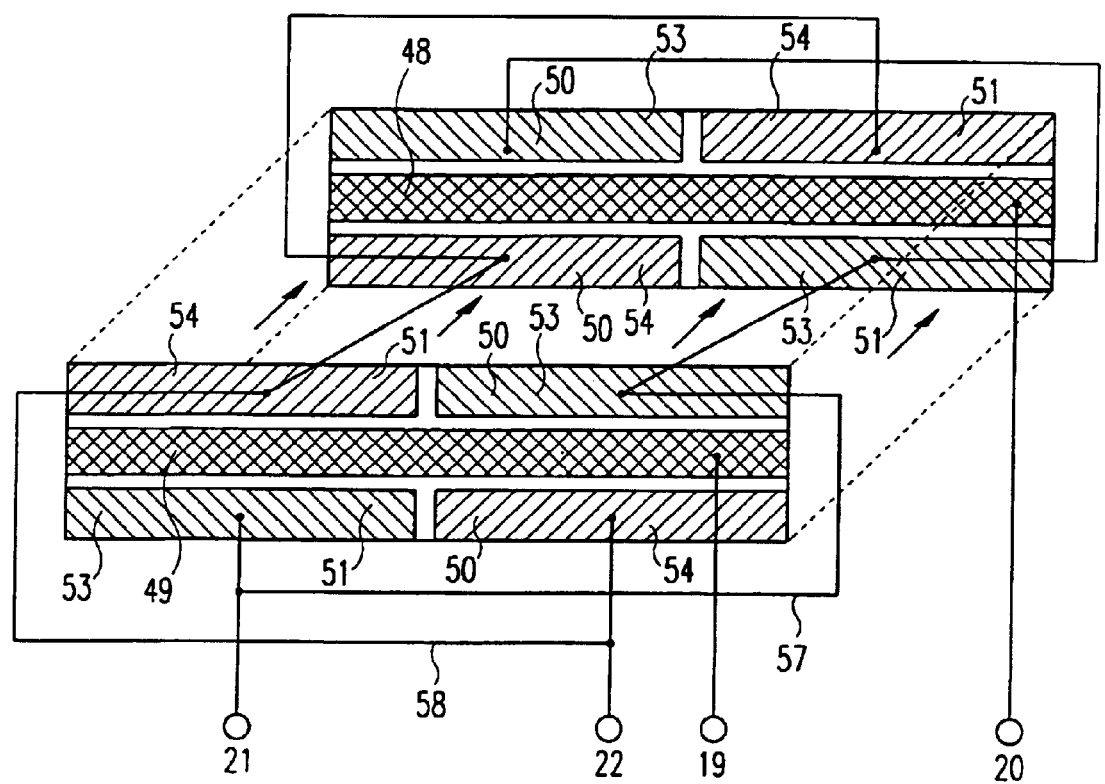

In the oscillator according to FIG. 15 two flexural wave generators 18 and one longitudinal wave generator 17 are provided analogously to the transducer shown in FIG. 9. The generator 17 is formed by the first electrode group 12 including the electrodes 48, 49. The two generators 18 originate by the two electrode groups 13 which include the electrodes 50, 51 and the electrode parts 53, 54 and the insulating intermediate areas.

Figure 16:
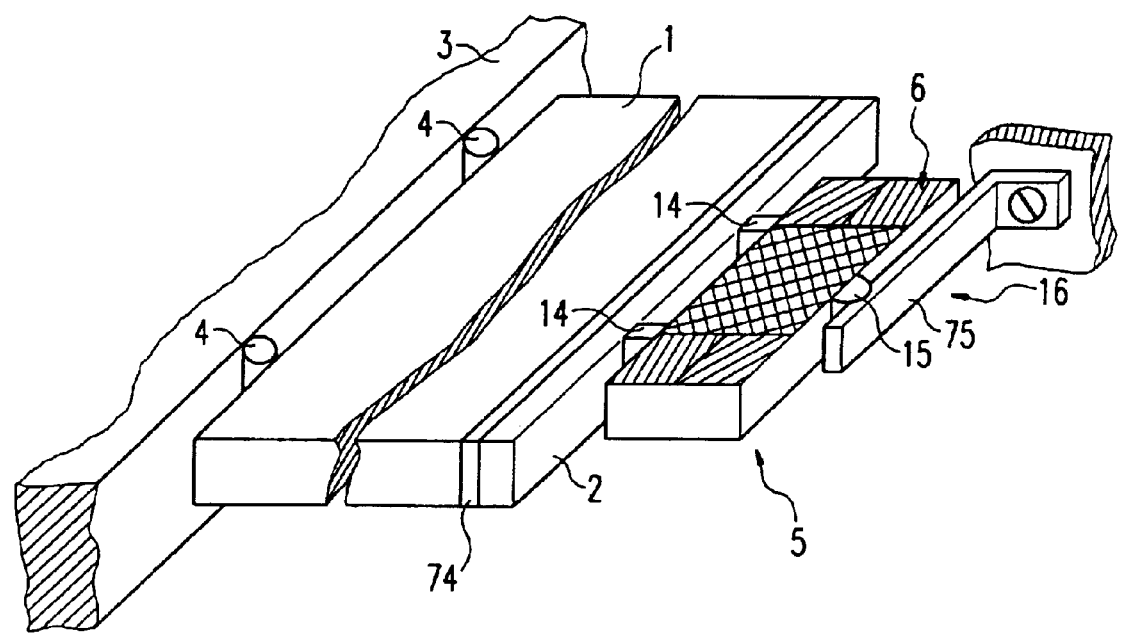

FIG. 16 discloses one of the design versions of the proposed motor wherein a ½ mode oscillator of the longitudinal type effecting translational movements of the driven element is employed as the driving element 5. With this design version of the motor an oscillator 6 can be used which comprises the electrode group configurations shown in FIGS. 11 to 15. In the piezoelectric motor illustrated in FIGS. 17 and 18 the pressing of the friction elements 14 of the oscillator 6 against the friction layer as well as the transverse fixing of the oscillator 6 by fixing elements 15 are realised. In particular two bending resonance plates 76 are provided. The resonance plates 76 are securely fastened on the small surfaces 8 of the oscillator 6 along the lines m and at the motor housing. Each resonance plate 76 has an outer 77 and an inner 78 frame, and separating intermediate gaps 79 and two connecting bridges 80 are provided.

Figure 19:
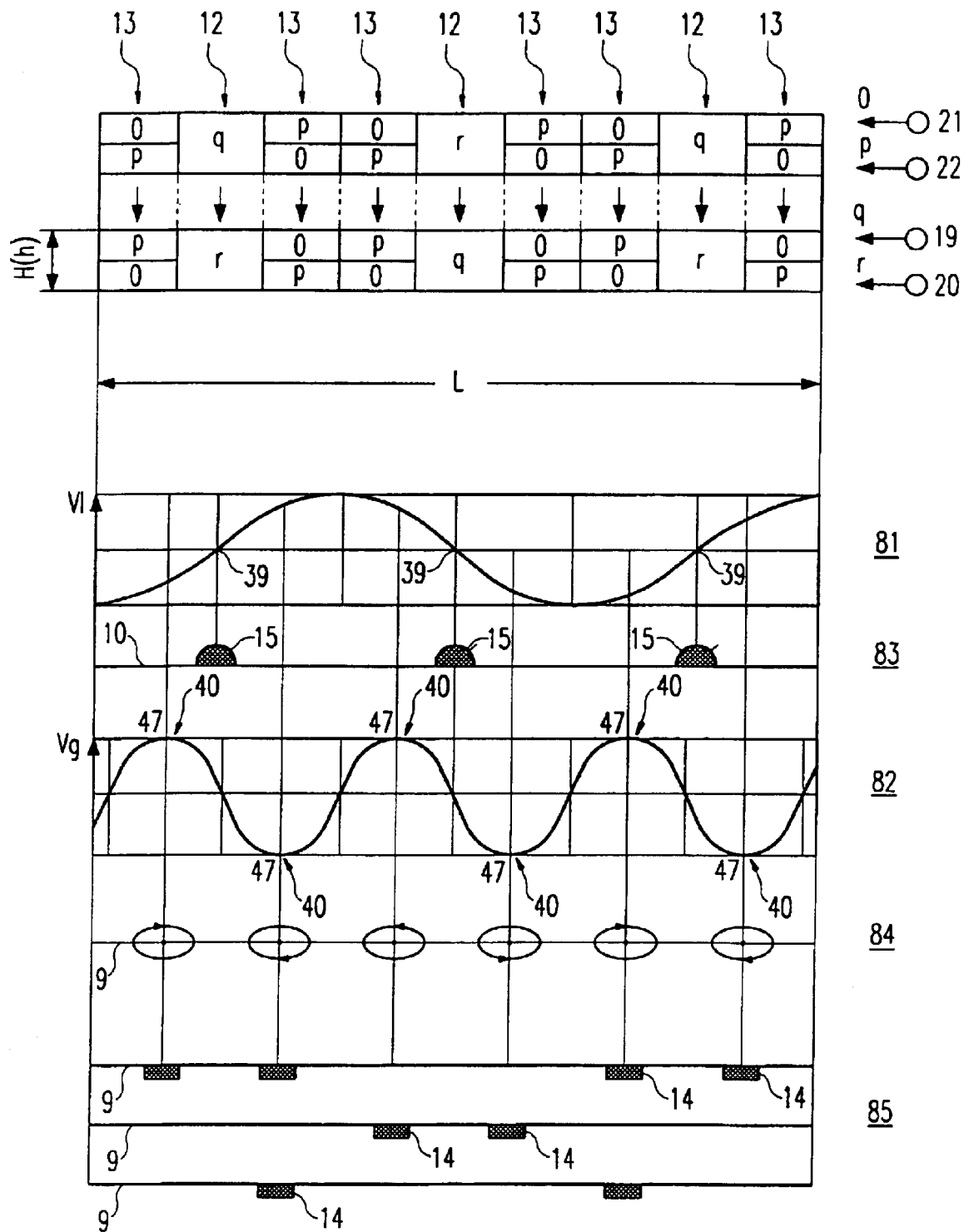
Figure 20:
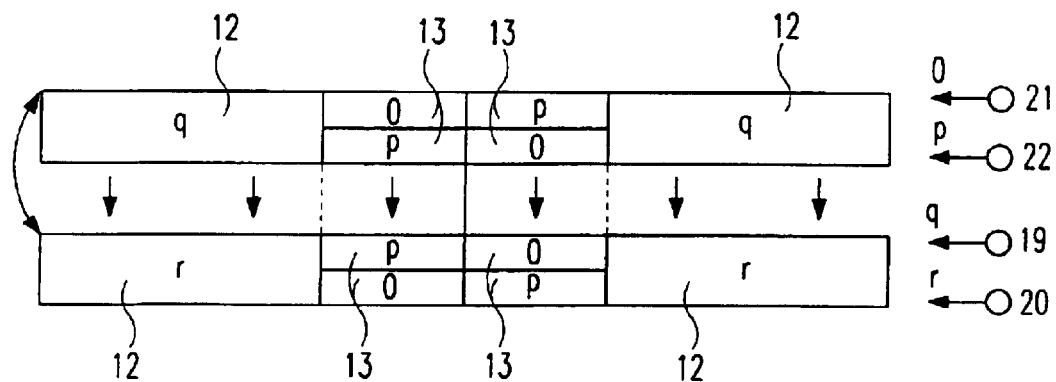
Figure 21:
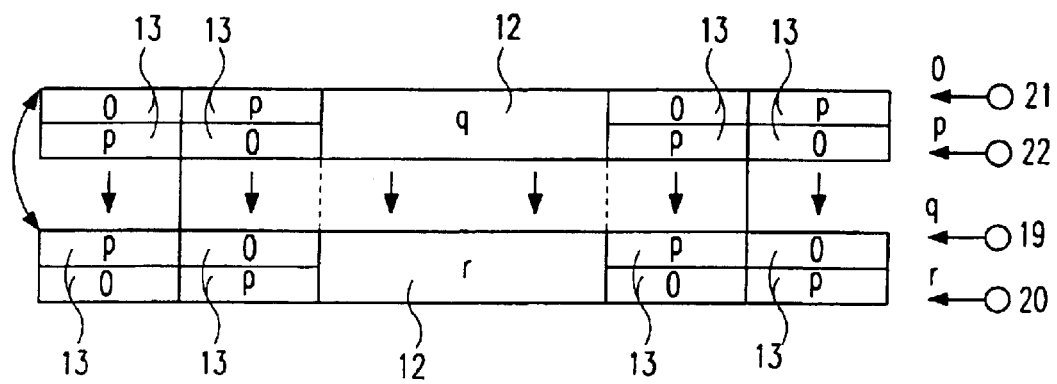

FIGS. 19 to 21 show electrode configurations of a ⅜ mode oscillator 6. All electrodes identified by o, p, q, r are connected by connecting lines 21, 22, 19, 20 which are identified by the same letters. The oscillator 6 with the electrode configuration illustrated in FIG. 19 has three generators of standing longitudinal waves and four generators of standing flexural waves. The oscillator 6 with the electrode configuration illustrated in FIG. 20 has two generators of standing longitudinal waves and one generator of standing flexural waves.

The oscillator 6 with the electrode configuration illustrated in FIG. 21 has one generator of standing longitudinal waves and two generators of standing flexural waves.

In positions E1 and 82 according to FIG. 19 diagrams of the distribution of oscillations velocities Vl and Vg along the line L of the ⅜ mode oscillator 6 are illustrated. Position 83 discloses the location of the fixing elements 15 on the upper surface of the oscillator 6. The position 85 shows trajectories of the points which are located at the sites 47 of oscillation velocity maxima of the standing flexural wave on the lower surface 9 of the oscillator 6. The position 85 shows possible locations of the friction elements 14 on the surface 9 of the oscillator 6.

Figure 22:
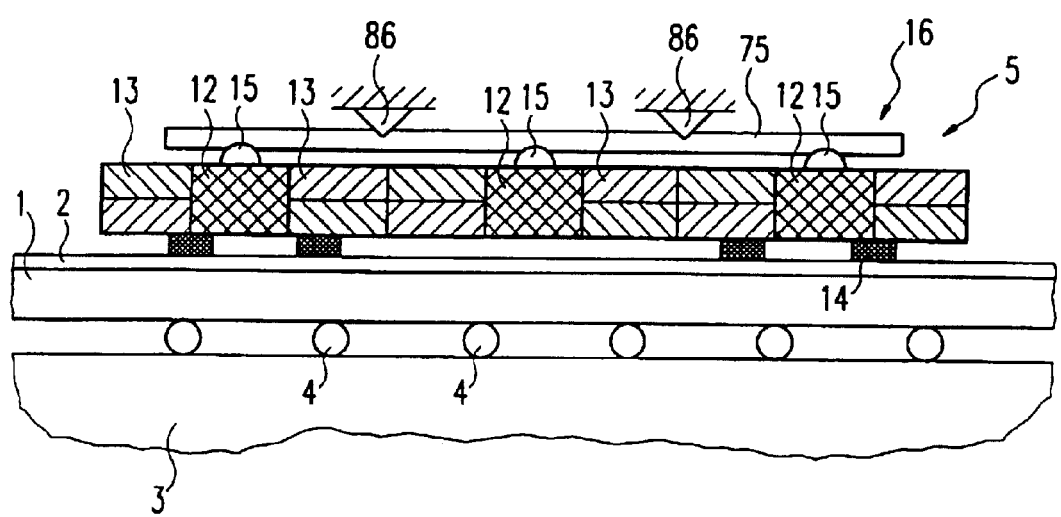

FIG. 22 is a design version of the piezoelectric motor with the ⅜ mode oscillator. The configuration of the electrode groups may be as shown in FIGS. 19, 20, and 21. The oscillator 6 of this motor includes four friction elements 14 and three fixing elements 15. The fixing elements 15 are disposed in the three nodes 39 of the standing longitudinal wave. These are located in their position with respect to the housing by means of a pressure device 16. The pressure device 16 can consist of a flat spring 66 and two stationary carriers 86. The positions 87, 88, 89, 90, 91, and 92 represent possible friction elements 14 and their embodiments. The friction elements 14 are manufactured in the form of thin strips of a hard wear-resistant material component, e.g. oxide ceramic, metal ceramic, or of combinations with other materials. Moreover, materials based on aluminium oxide, zirconium oxide, silicon carbide, or similar materials can be employed.

Various embodiments of the friction elements 14 are possible. These can, for example, have the shape of rectangles, squares, trapezoids, or semi-spherical elements (see FIG. 23).

The width tr of the friction elements must be approximately five times smaller than the half-wave length λt/2 of the acoustic flexural wave which propagates in the oscillator 6.

The height hr of the friction elements 14 is in most cases equal to the oscillator thickness D. The friction elements 14 are securely fastened on the lower surfaces of the oscillator 6 in points of the defined maxima of the oscillation velocities 47 of the acoustic standing flexural wave as is shown for example in FIGS. 3, 9, and 19.

The friction element can also be secured on the lateral surfaces 8 of the oscillator 6 as shown in FIG. 10.

Figure 23:
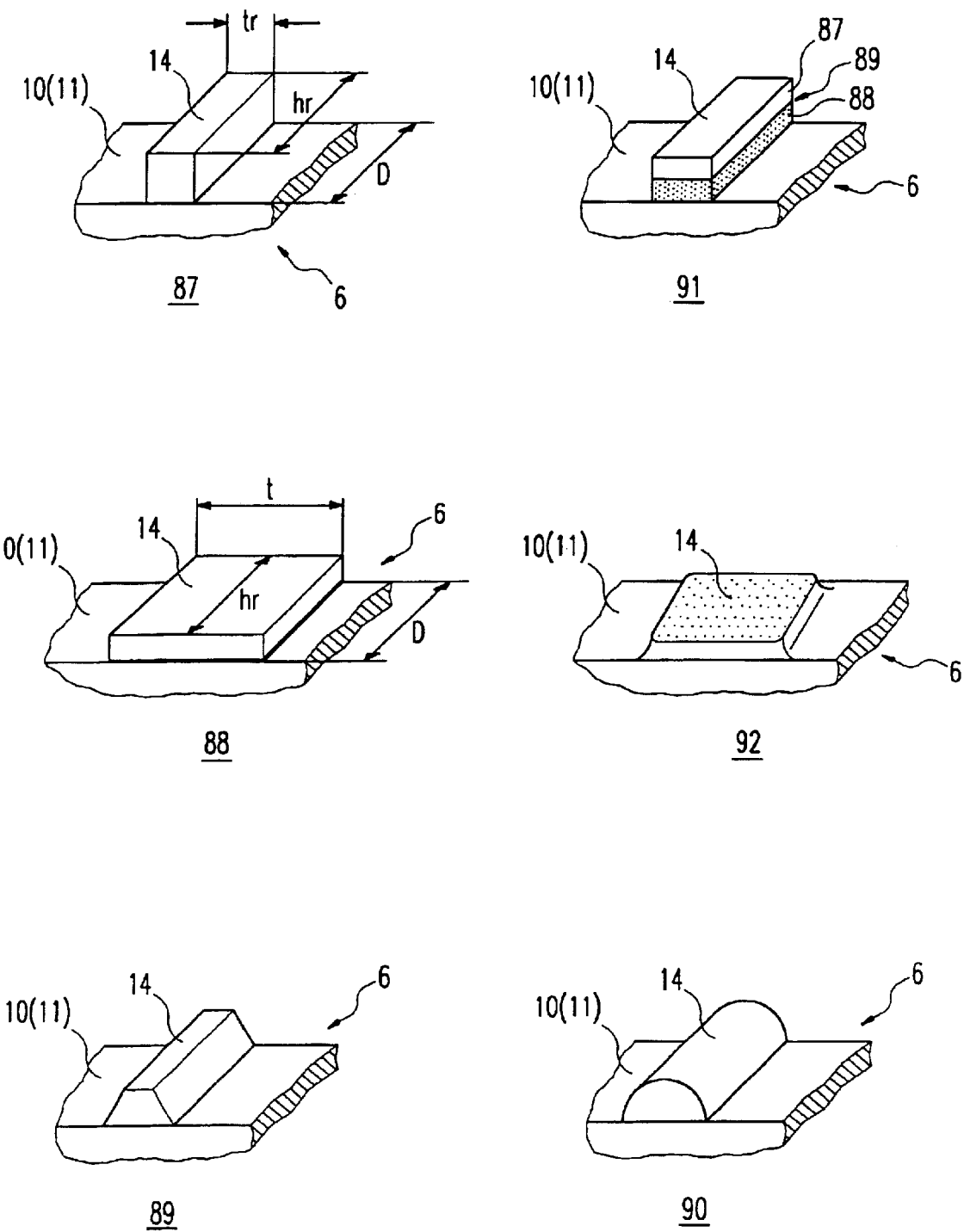

The friction elements 14 may have a single (FIG. 23, Pos. 87, 88, 89, 90), two- or three-layer structure (FIG. 23, Pos. 91).

In a two-layer structure of the friction element 14 the first layer 87 is manufactured from a wear-resistant material component with a high friction coefficient compared to the friction layer 2 of the driven element 1. The second layer 88 consists of a hard porous material component. Both layers 87 and 88 are joined by bonding in a sintering process so that in the interface area of the first 87 and the second 88 layer a third intermediate transition layer 89 can be formed in a controlled manner.

The fastening of the friction element 14 on the small surfaces 10 and 11 of the oscillator 6 can be done by means of organic epoxy resin adhesives. Joining is also conceivable by chemical reaction, e.g. by means of low-melting lead-containing glass.

In the mentioned cases the pores out or up the second layer 88 of the friction element 14 can be filled with a bonding substance so that an optimum contact-making is obtained.

Furthermore, the friction elements 14 can be formed as glass strips which are melted on the surfaces 10 and 11 of the plate-shaped piezoelectric oscillator. The glass is blended with a powder of a hard wear-resistant material, e.g. aluminium oxide, zirconium oxide, silicon carbide, titanium carbide, or similar materials or their mixtures.

Figure 24:
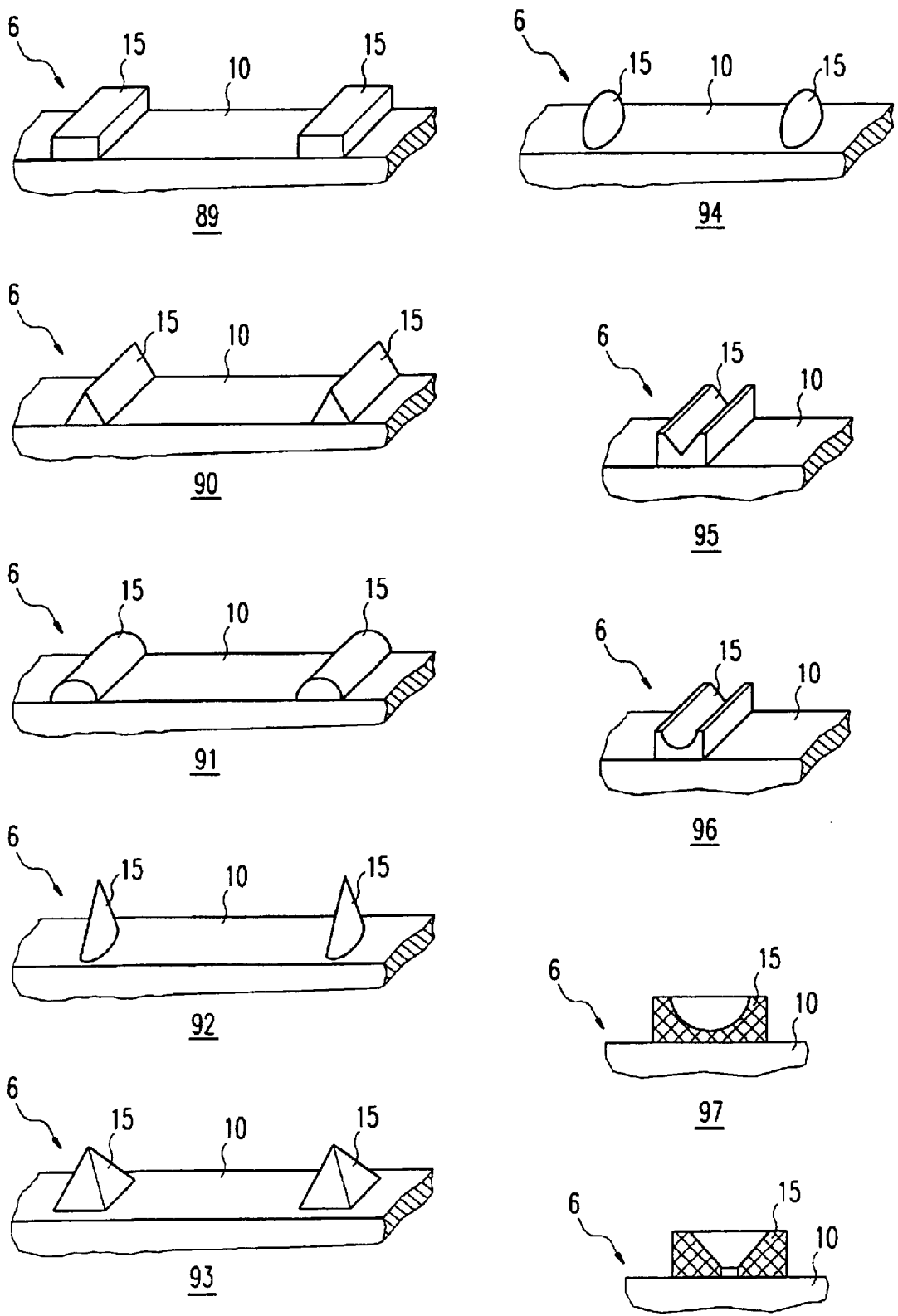

FIG. 24, positions 89 to 98, shows conceivable embodiments of fixing elements. These can be designed as rectangular prisms 89, triangular prisms 90, semi-cylindrical prisms 91, or conical elements 92, pyramid-shaped elements 93, semi-spherical element 94, rectangular elements with profile grooves 95, 96, round elements with profile holes 97, 98, or as similar elements.

The fixing elements 15 shown in FIG. 24 can be manufactured from a material whose modulus of elasticity is approximately equal to or slightly higher than the modulus of elasticity of the piezoelectric ceramic of the transducer 6. They may consist of a material whose modulus of elasticity is much smaller than the modulus of elasticity of the piezoelectric ceramic of the transducer. But the elements can also be made from the same type of piezoelectric ceramic as the transducer itself. The fixing elements 15 or parts of same which will contact the surface of the oscillator 6 may consist of a porous oxide ceramic or another porous material.

Figure 25:
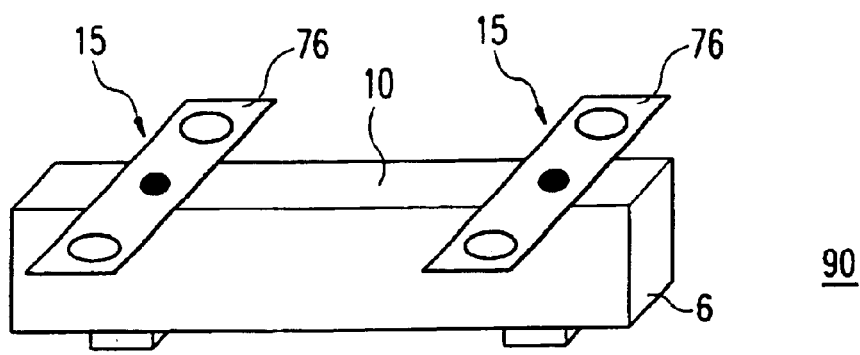
Figure 25:
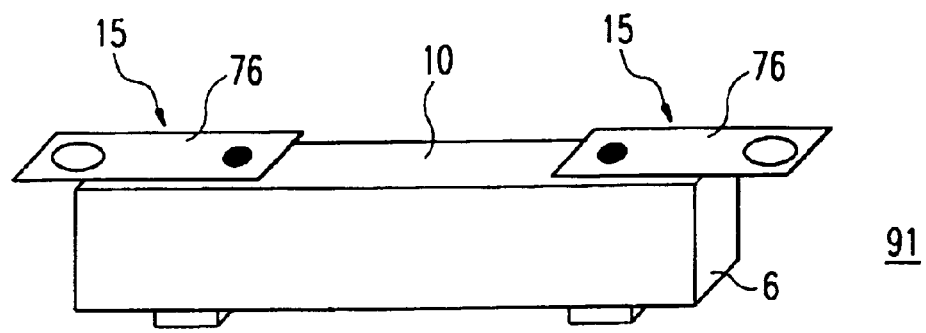
Figure 25:
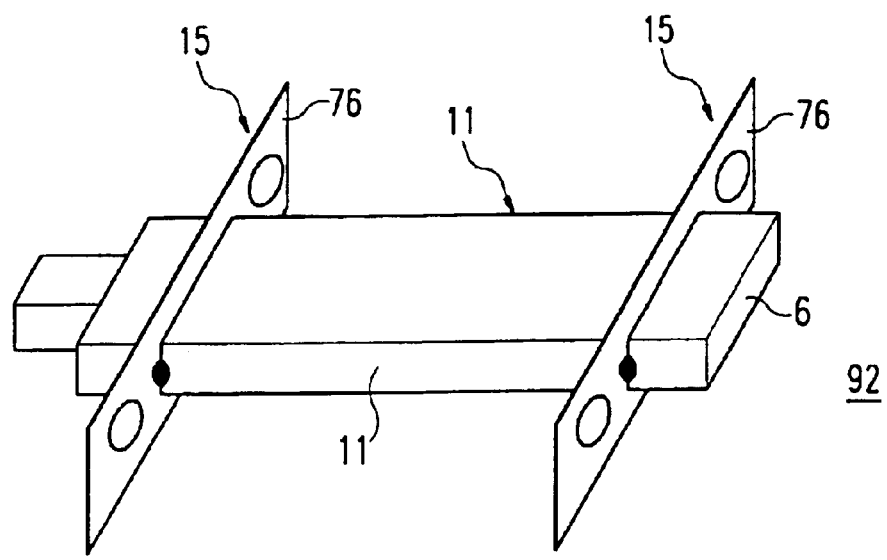

FIG. 25, positions 90 to 92, shows fixing elements 15 in the form of bendable resonance plates 76. Position 90 discloses a transverse-type and position 91 a longitudinal-type fastening of the resonance plates 76. In position 92 the bending resonance plates 76 are illustrated which are designed in the form of two frames encompassing the oscillator 6.

In the proposed drive the fixing elements 15 are rigidly joined with the surface 9 of the oscillator or transducer 6. Such a joint may be made by means of organic adhesives, e.g. based on epoxy resin. Moreover, a joint with the surface 10 of the oscillator can be made by utilising a substance which makes or enables a chemical contact between piezoelectric ceramic and the material of the fixing element 15.

Figure 26:
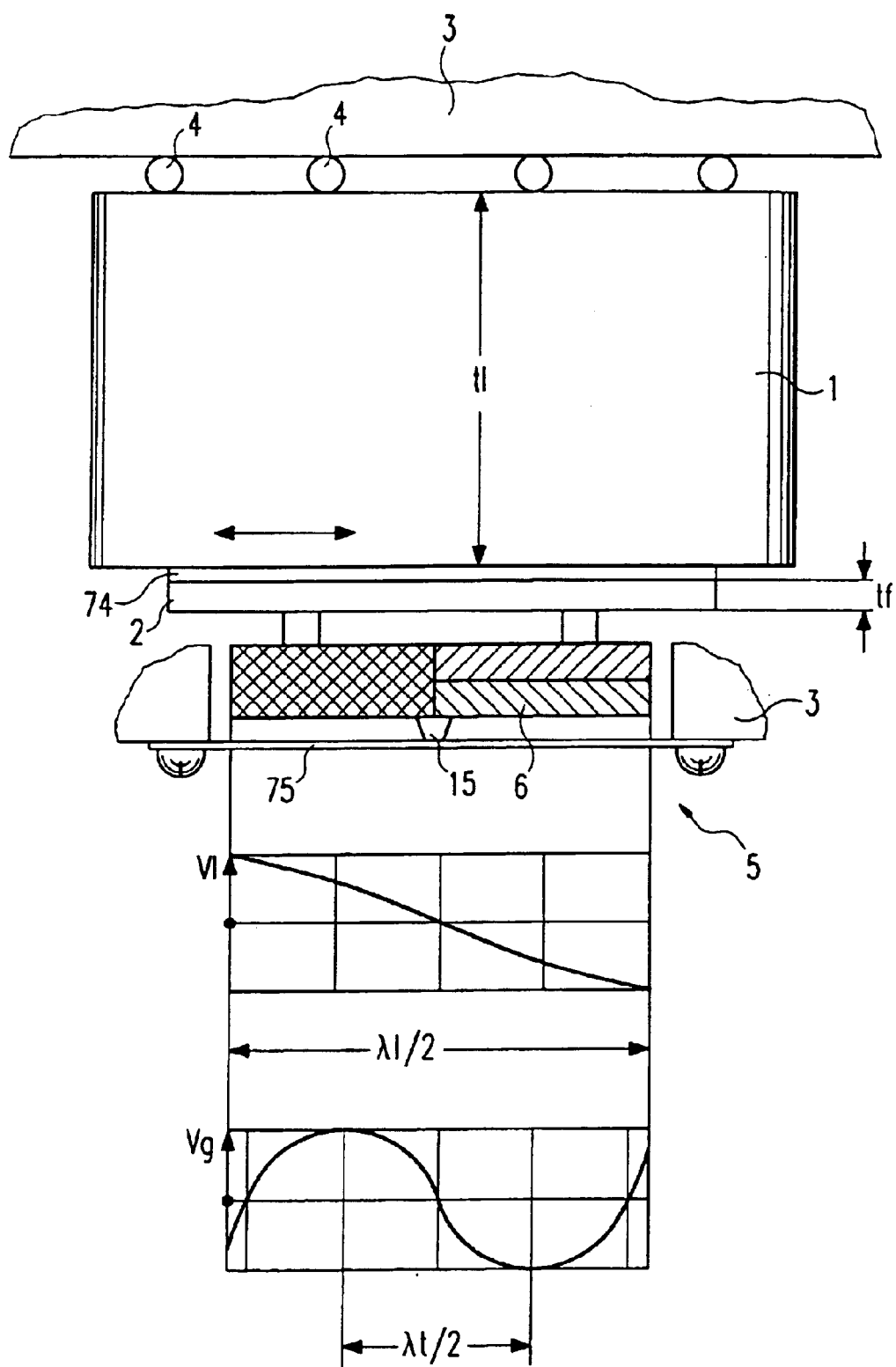

FIG. 26 shows one of the design versions of the proposed motor wherein the friction layer 2 is formed as an oxide ceramic layer with a thickness tf which is at least five times smaller than half of the wave length 91 of the standing longitudinal wave which propagates in the plate-shaped oscillator. In such a piezoelectric motor the thickness tl of the body of the driven element 2 may be greater than one half-wave length λt of the acoustic flexural wave which develops in the transducer 6.

Between the body of the driven element 1 and its friction layer 2 a damping layer 74 may be arranged which consists of a sound-absorbing material.

Figure 27:
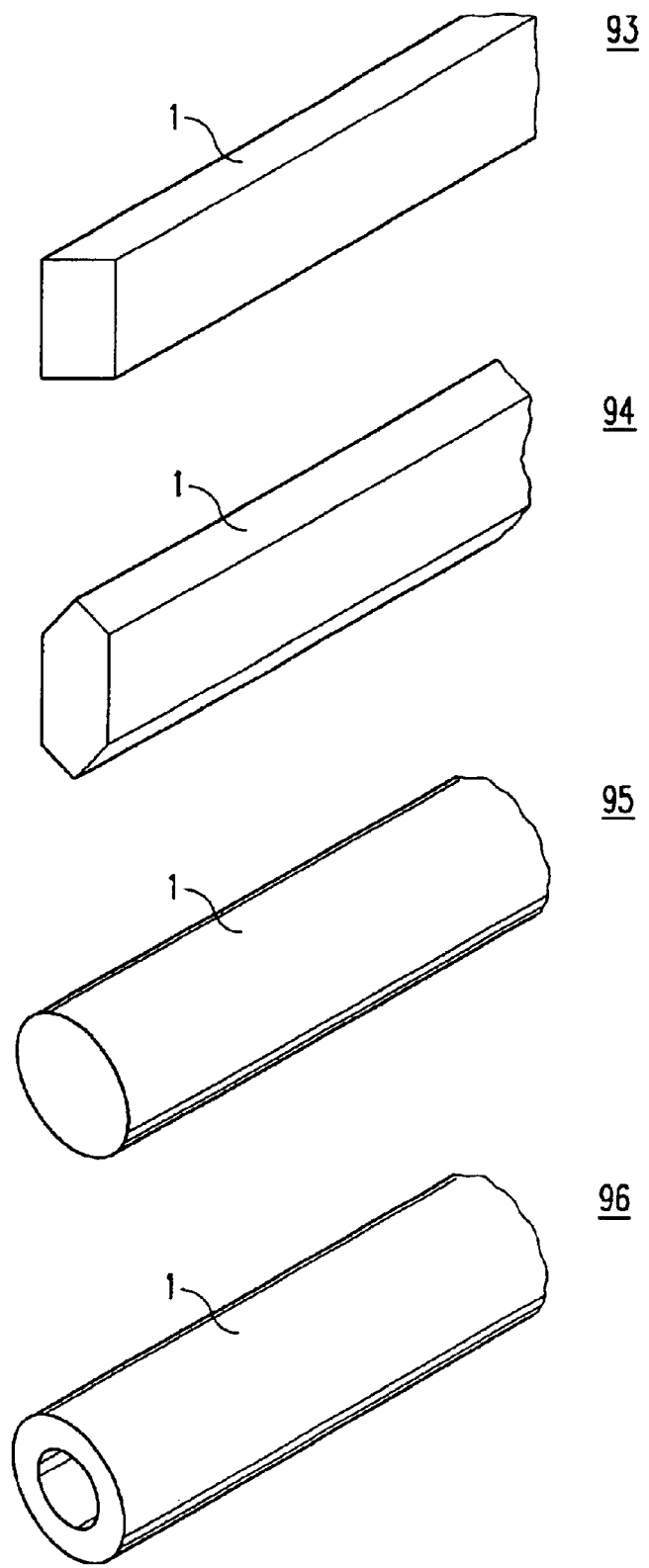

FIG. 27 shows design versions of the driven element in the form of a bar with a rectangular, polygonal, or round cross-sectional shape or as a tube, respectively, with reference to be made here to positions 93 to 96.

Figure 28:
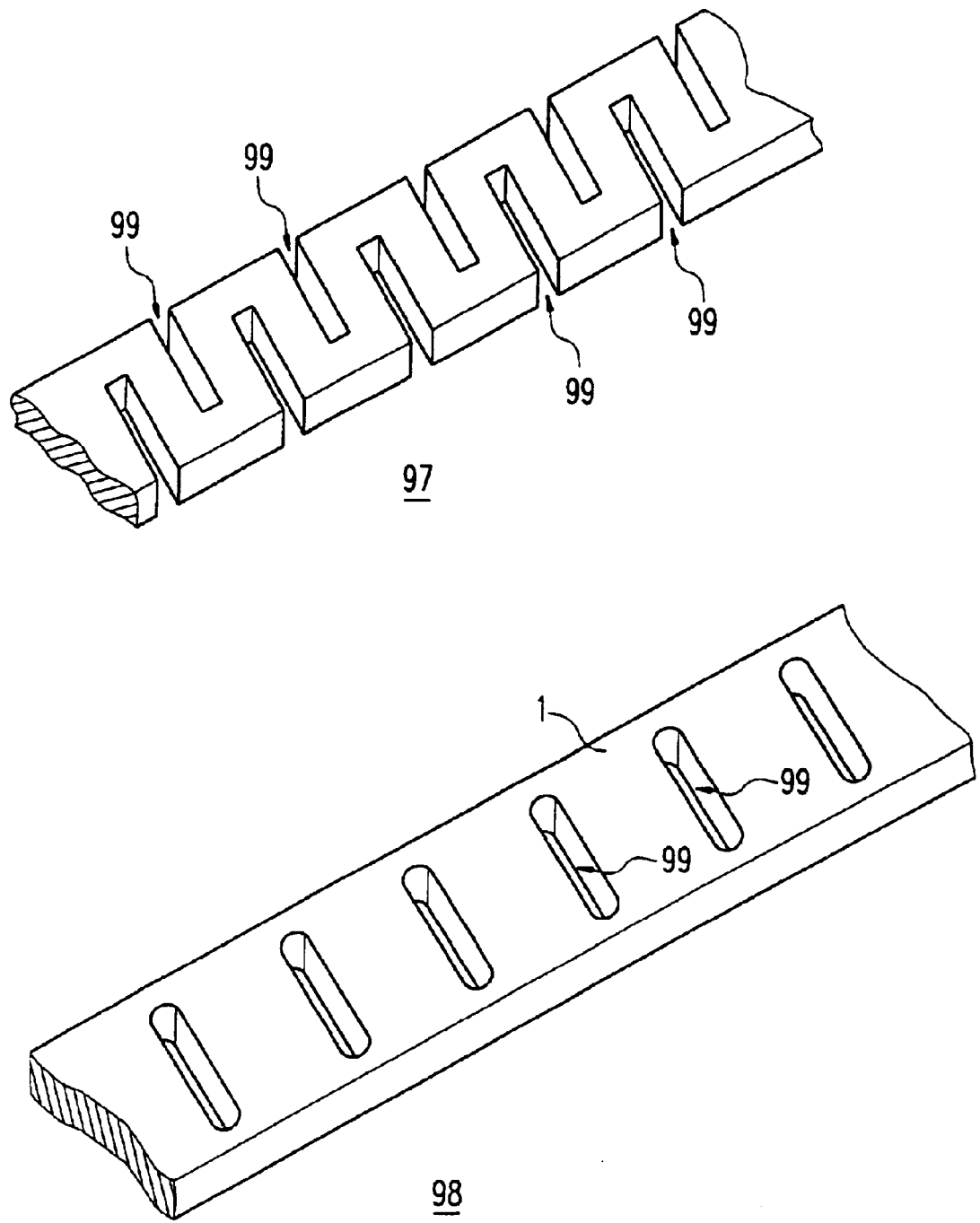

FIG. 28 with the positions 97 and 98 shows design versions of the driven elements whose bodies are periodically provided with damping grooves 99 or corresponding recesses 99. The driven element in FIG. 27 or 28 may consist of a hard porous material. The pores can be filled with a sound-absorbing material, e.g. silicone or rubber.

Figure 29:
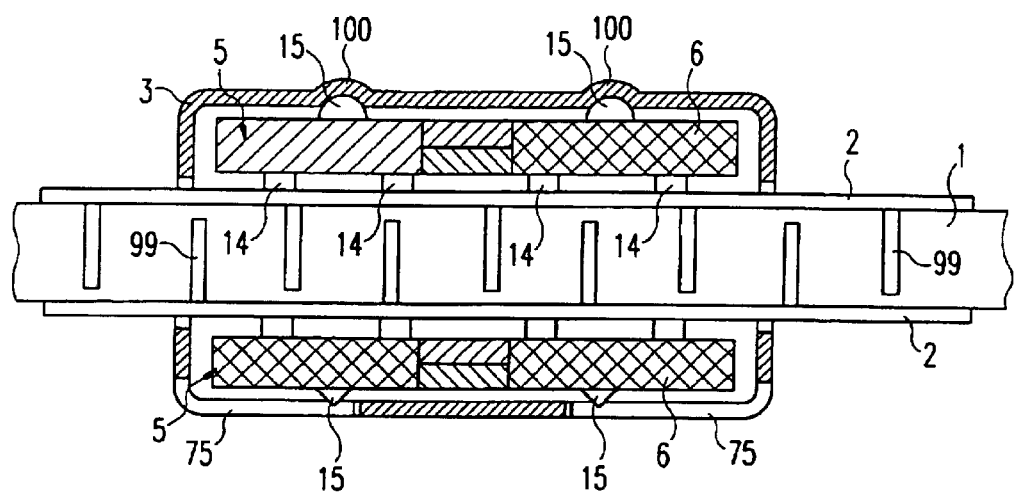

The design version of the motor shown in FIGS. 29/30 includes two opposite transducers 6 and two friction layers 2. These lie in one plane and parallel to one another at the opposite sides of the driven element 1.

In this design version of the motor semi-spherical elements 15 of an oscillator are disposed in semi-spherical girders 100. The girders 100 are formed as indentations in the housing 3. The second one of the oscillators 6 has conically formed fixing elements 15 which are subjected to the force of two flat springs 75 which press the friction elements 14 against the friction layer 2 of the driven element 1.

Figure 31:
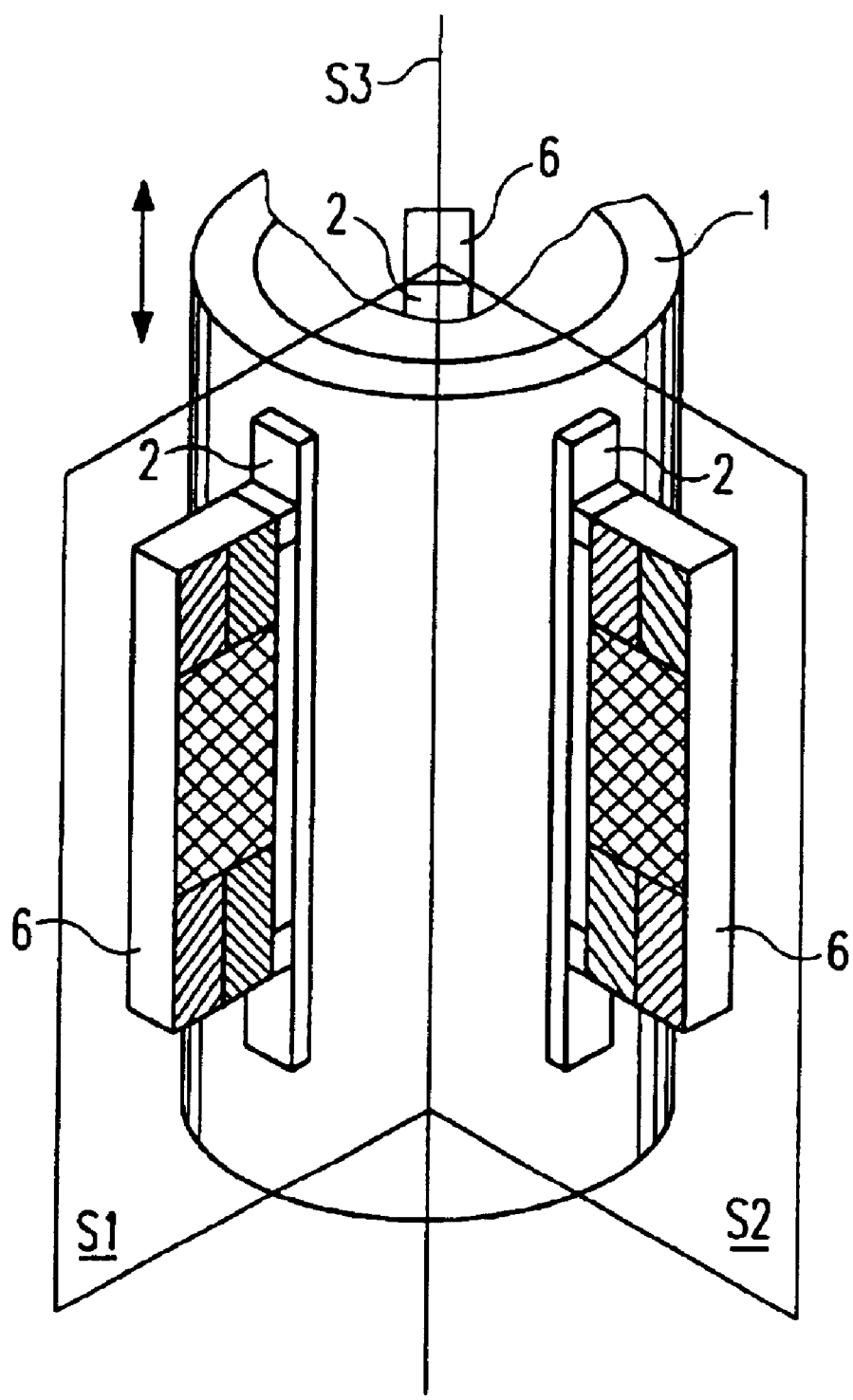

In the design version according to FIG. 31 a drive is shown wherein three transducers 6 and three friction layers 2 are formed. These are arranged in three plane S1, S2, and S3.

Figure 32:
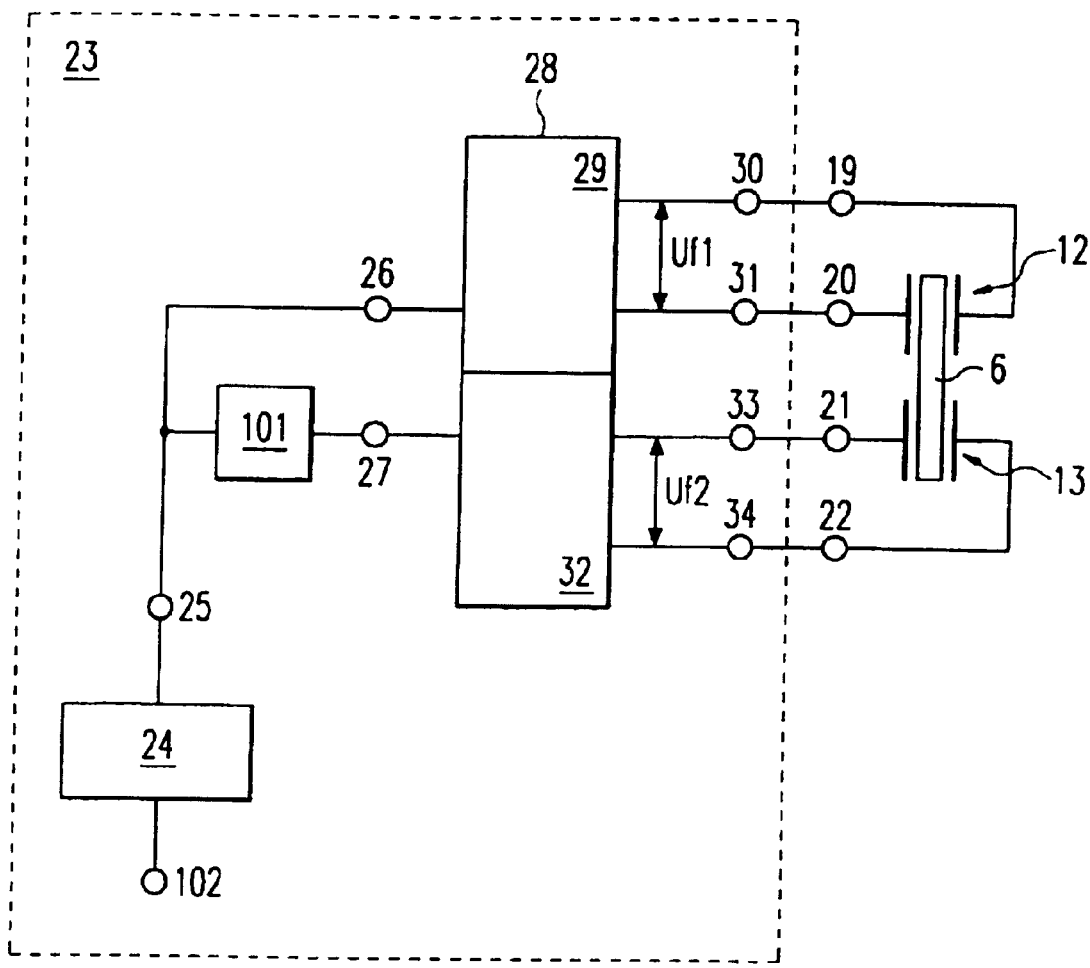

FIG. 32 shows a simple embodiment of an excitation source 23. The output 25 of the basic generator 24 is connected via a phase shifter 101 with one of the signal inputs 27 or 26 of the two-channel power amplifier 28. The basic generator 24 has a control input for the excitation frequency 102.

Figure 33:
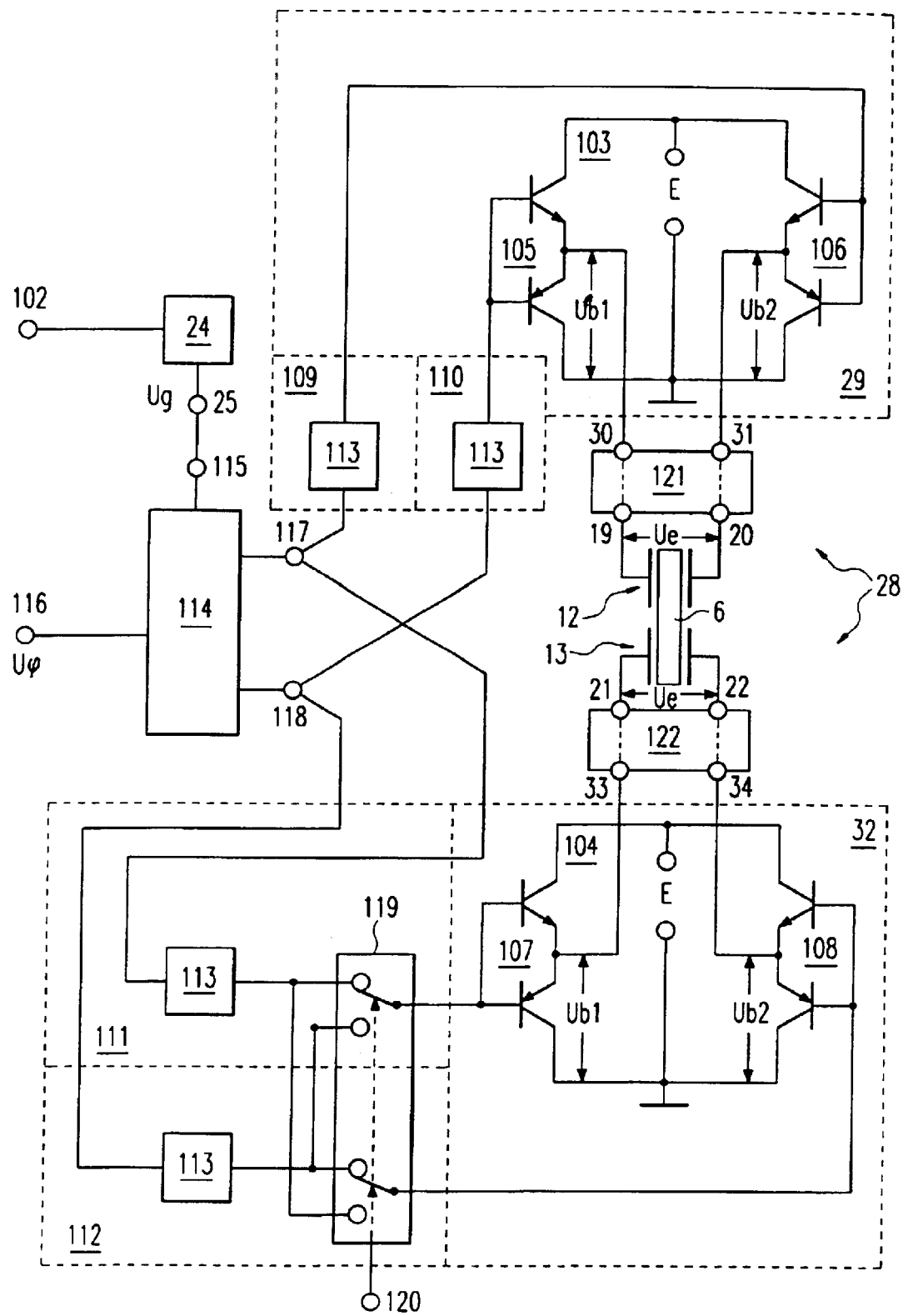

FIG. 33 shows an advanced version for the electric excitation. Here, the first 29 and the second 32 channel of the power amplifier 28 are designed as bridge power amplifiers 103 and 104 with the direct current voltage sources E. Each of the amplifier 103, 104 comprises two half-bridge amplifiers 105, 106 and 107, 108 with the excitation channels 109, 110, and 111, 112 which are provided with the signal phase controller 114, a control input 116, a support voltage input 117, and with the output of the phase variable voltage 118. One of the channels 29 or 32 of the power amplifier may have an electronic changeover switch 119 with a control input 120, which enables the output changeover of the excitation channels.

In this design version the connections 19, 20 of the first electrode group 12 of the transducer 6 are connected via a filter 121 with the outputs 30, 31 of the first channel 29 of the power amplifier 28.

The connections 21, 22 of the second electrode group 13 are connected via the filter 122 with the outputs 33, 34 of the second channel 32 of the power amplifier 29.

Figure 34:
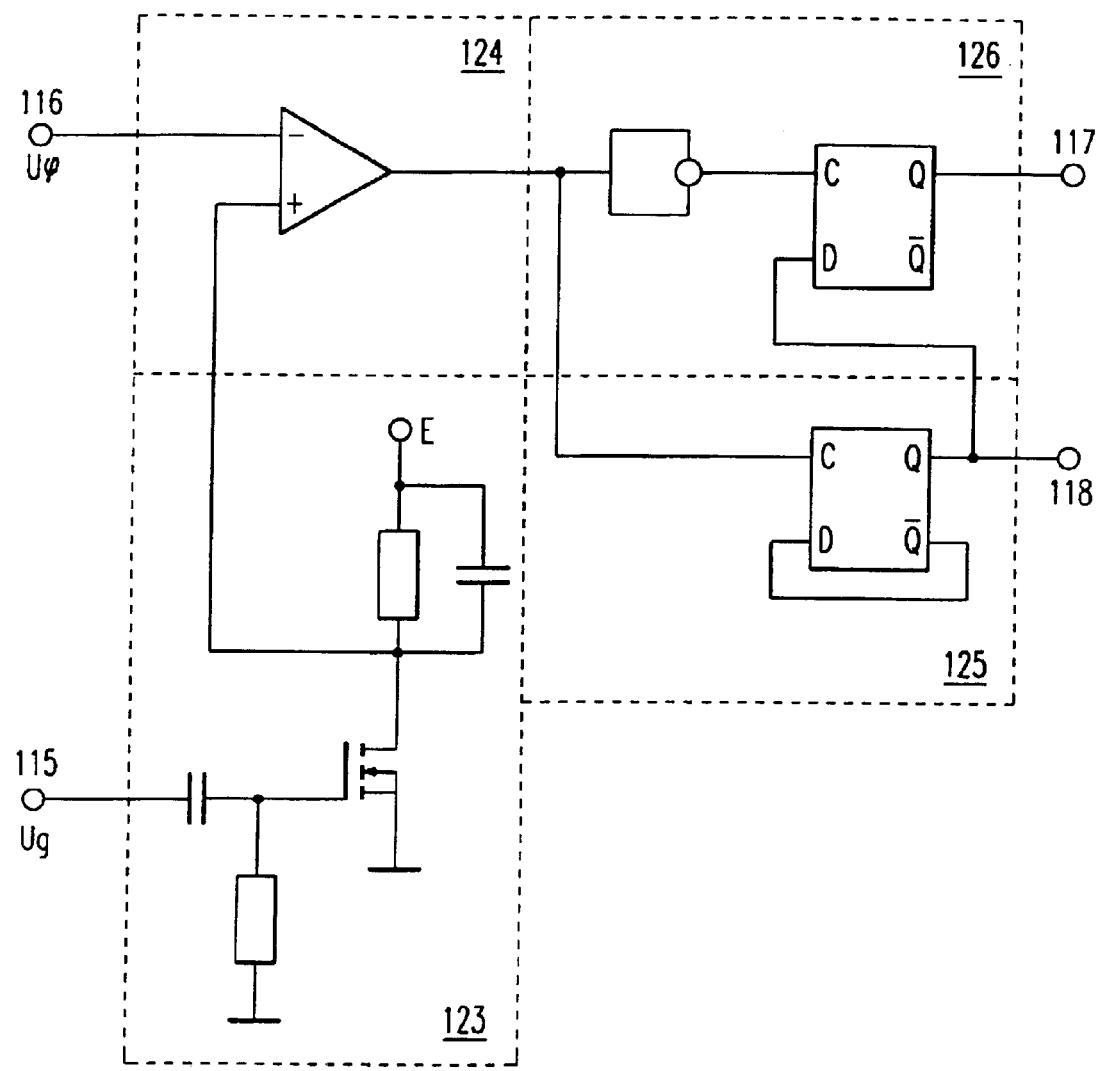

FIG. 34 discloses a design version of the phase controller 114. This includes a saw tooth voltage-shaping member 123, a pulse duration modulator 124, a support voltage shaper 125, and a shaper for the phase variable voltage 126.

Figure 35:
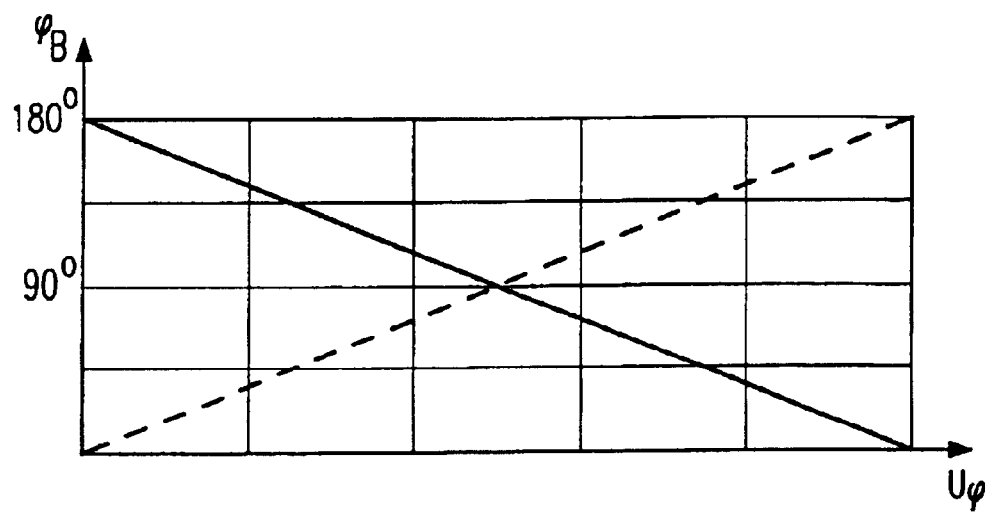

FIG. 35 explains the dependency of the phase shift $\phi_B$ between the voltages at outputs 117 and 118 of the phase controller 114 from the control voltage $U_\phi$ at the output 116. The broken line shows a further version of the dependency of the phase shift.

Figure 36:
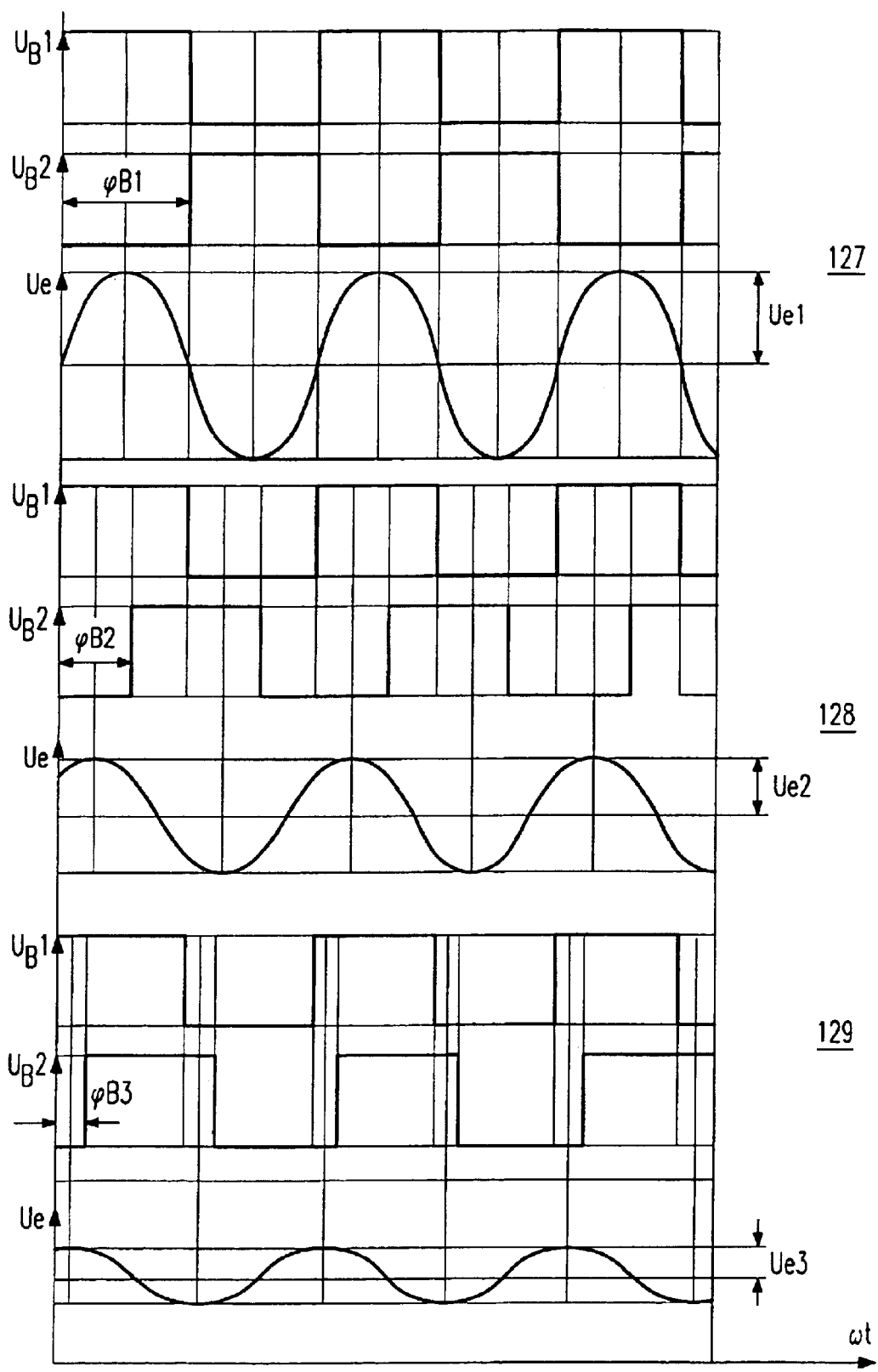

FIG. 36 illustrates diagrams of the voltage $U_B1$ between the output 30 or 33 and ground as well as of the voltage Ue between the connections 19 and 20 or 21 and 22. The positions 127 to 129 correspond to the different values of the phase shift $\phi B1$, $\phi B2$, $\phi B3$ which are assigned different voltage values Ue1, Ue2, Ue3.

Figure 37:
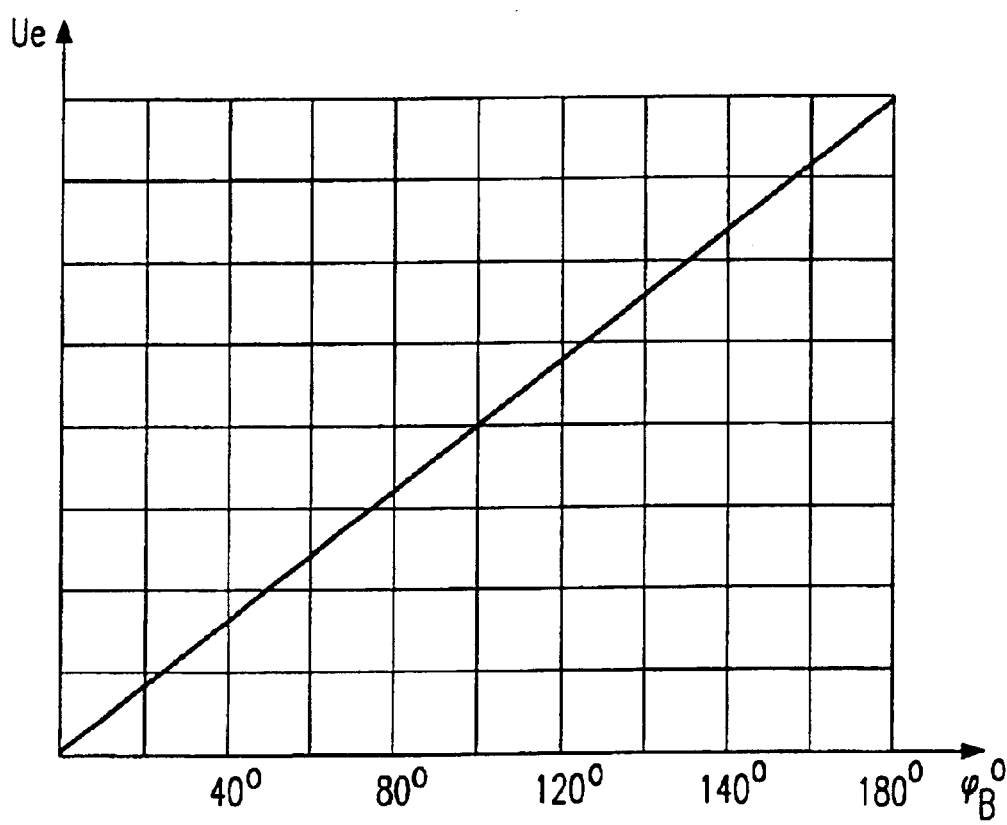
Figure 38:
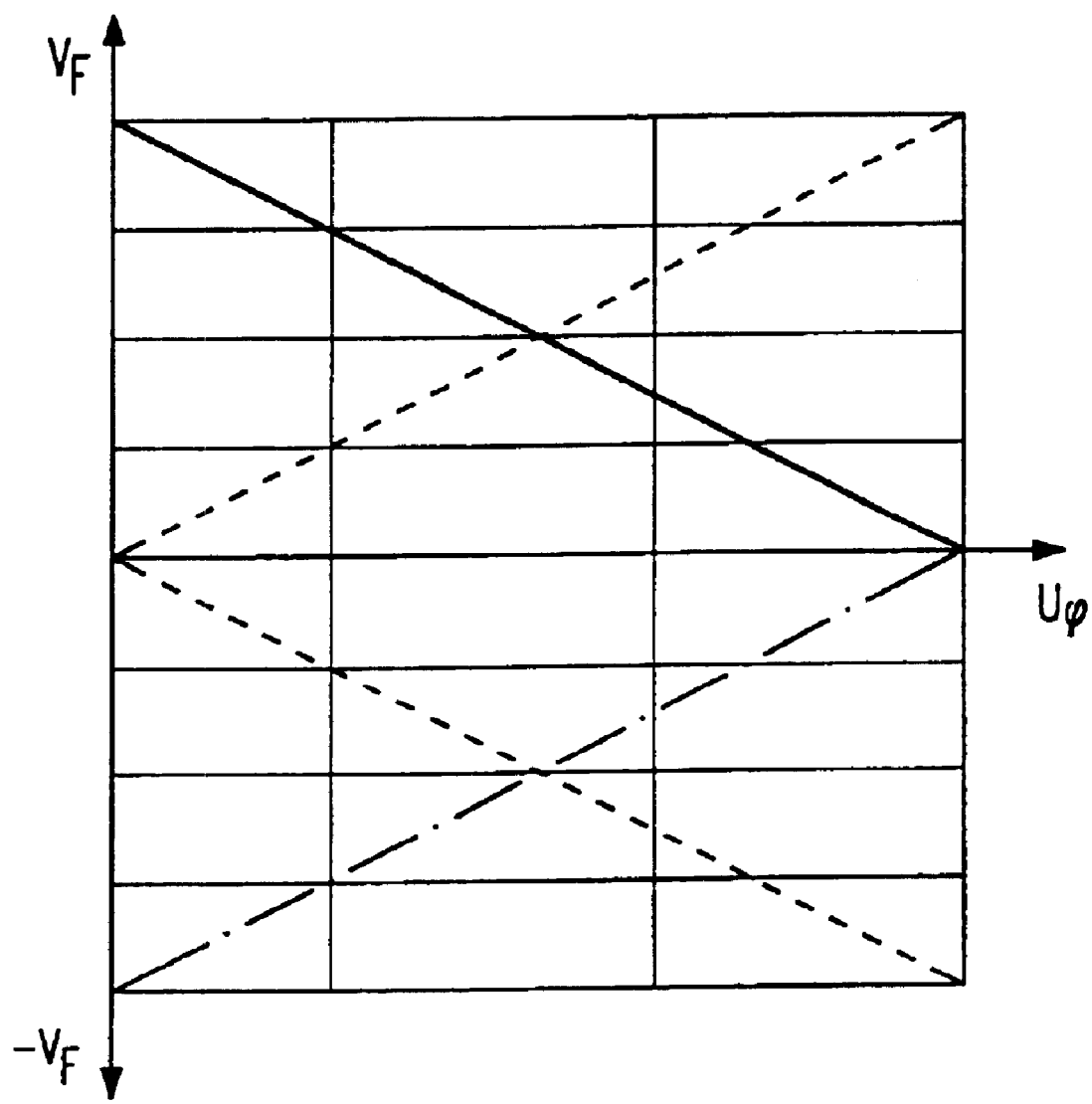

FIG. 37 shows the dependency of the phase shift $\phi_B$ of the phase controller 114 from the voltage Ue, with FIG. 38 showing the dependency of the movement velocity vf of the driven element 1 from the control voltage Uφ.

Figure 39:
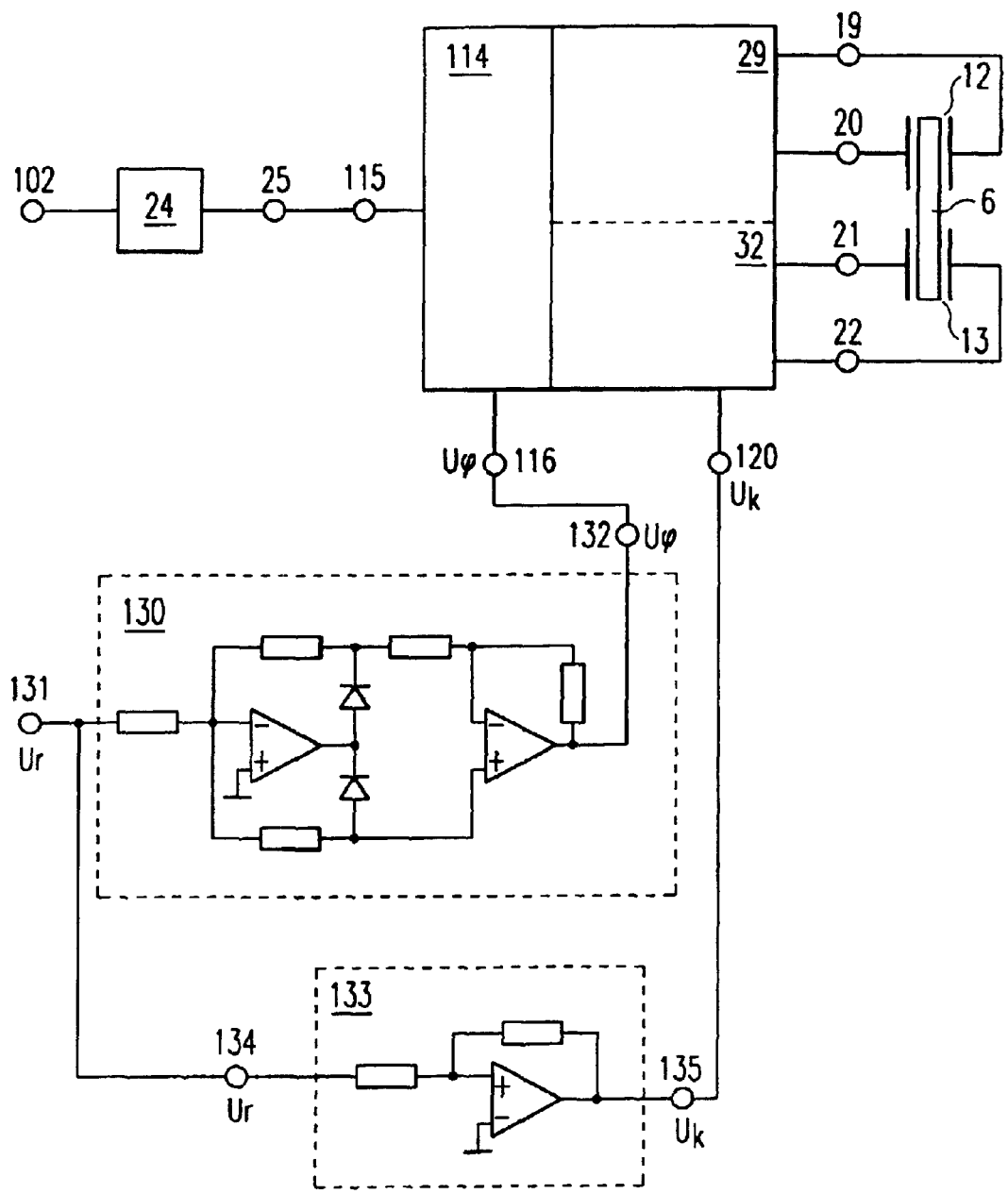

The version of the excitation source 23 shown in FIG. 39 is additionally equipped with a signal level transducer for the control signal 130. This version includes the control input 131, the output 132, and the zero signal detector 133 of the control signal with a control input 134 and a control output 135.

Figure 40:
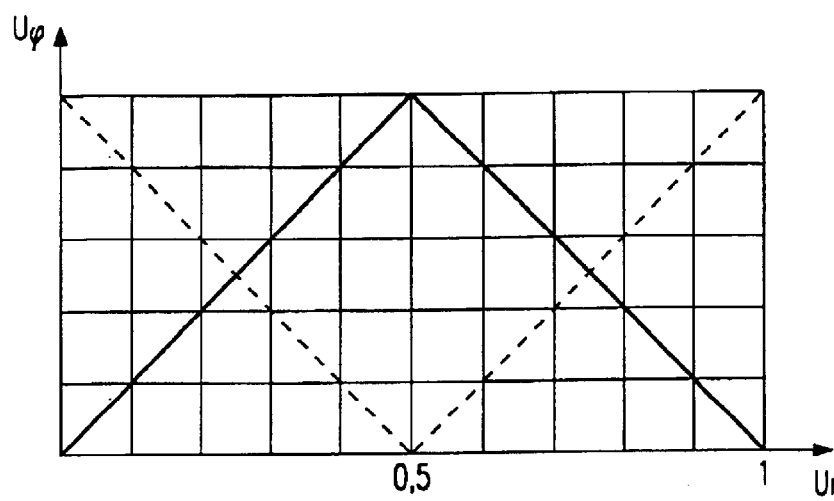
Figure 40:
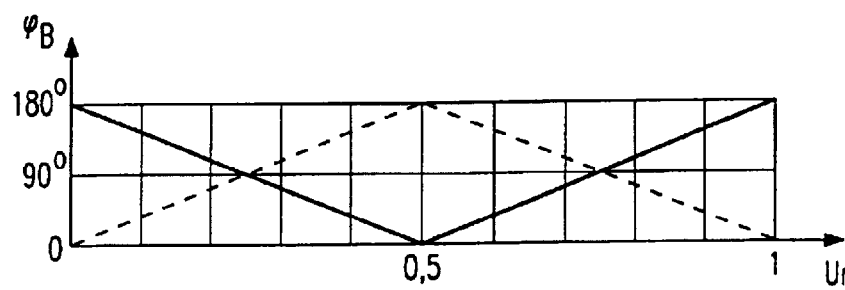
Figure 40:
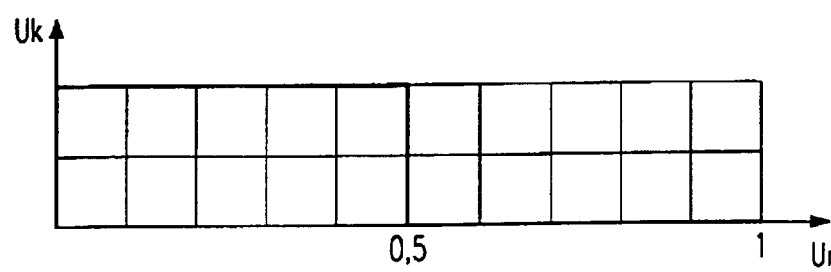
Figure 40:
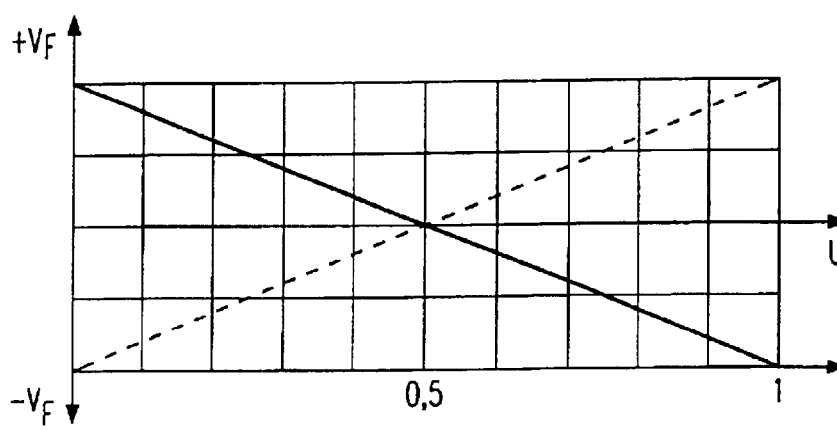

FIG. 40 shows voltage diagrams of the design version of the excitation source shown in FIG. 39. The diagram with position 136 discloses the dependency between the voltage Up at the output 132 of the signal level transducer of the control voltage 130 and the voltage Ur at the output 131.

The diagram with position 137 shows the dependency between the phase shift angle $\phi_B$ and the control voltage Ur of the phase controller 114. The diagram with position 138 indicates the dependency between the voltage at the output 135 of the zero signal detector 133 of the control signal and the control voltage Ur at its output 134. The diagram with position 139 discloses the dependency between the movement velocity vf of the driven element 1 and the control voltage Ur.

Figure 41:
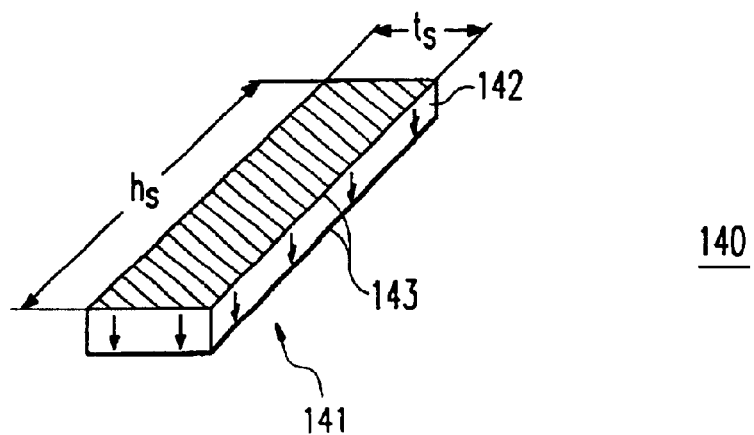
Figure 41:
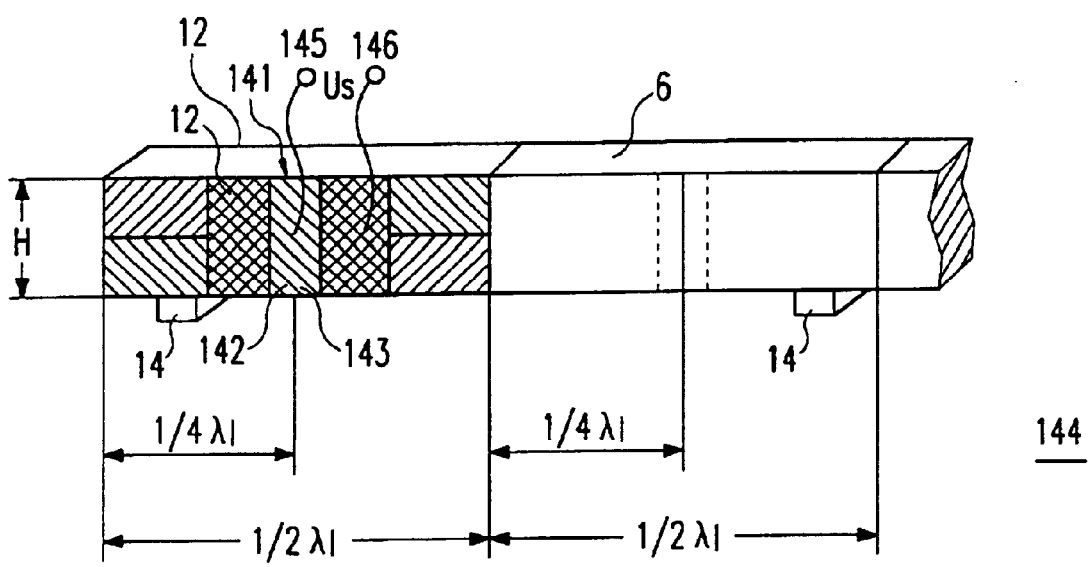
Figure 41:
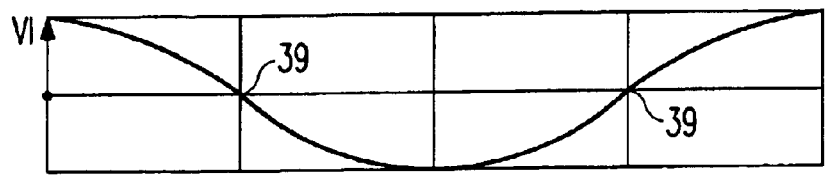

The position 140 according to FIG. 41 shows the design version of the sensor 141 for the determination of the component of mechanical longitudinal stresses. The sensor 141 has the form of a piezoelectric plate 142 which has a thickness ranging from 0.1 to 0.3 mm.

The plate 142 comprises an electrode 143 on its large surface and is polarised in the normal direction to this electrode 143.

The width $t_S$ of the plate is approximately ten times smaller than a half-wave length of the longitudinal wave originating in the transducer 6. The height $h_S$ can be equal to or greater than the oscillator width h. Position 144 according the FIG. 41 shows a fastening possibility of the sensor according to position 140 on the piezoelectric transducer 6. The sensor 141 is arranged on one of the large surfaces 7 of the transducer 6 at a site of one of the oscillation velocity nodes 38 of the flexural wave which propagates in the transducers 6 symmetrically with respect to the longitudinal axis.

The plate-shaped sensor 142 is bonded e.g. to the surface of the transducer 6 and soldered in position.

The sensor output 145 is connected with its upper electrode 143 and the output 146 is connected with the transducer 6.

Figure 42:
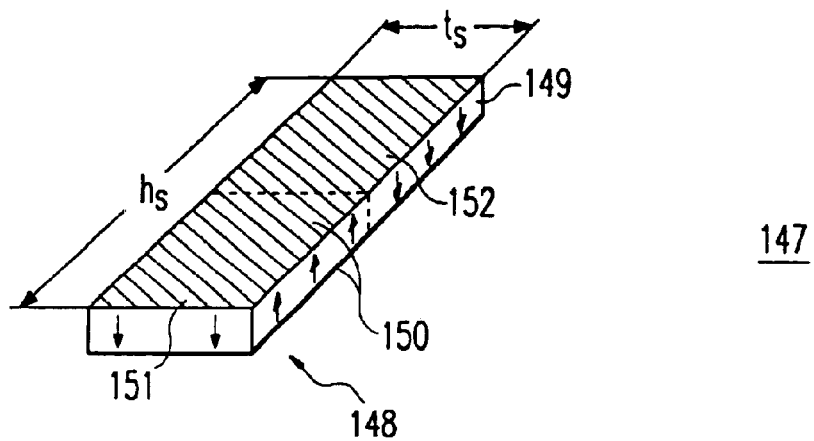
Figure 42:
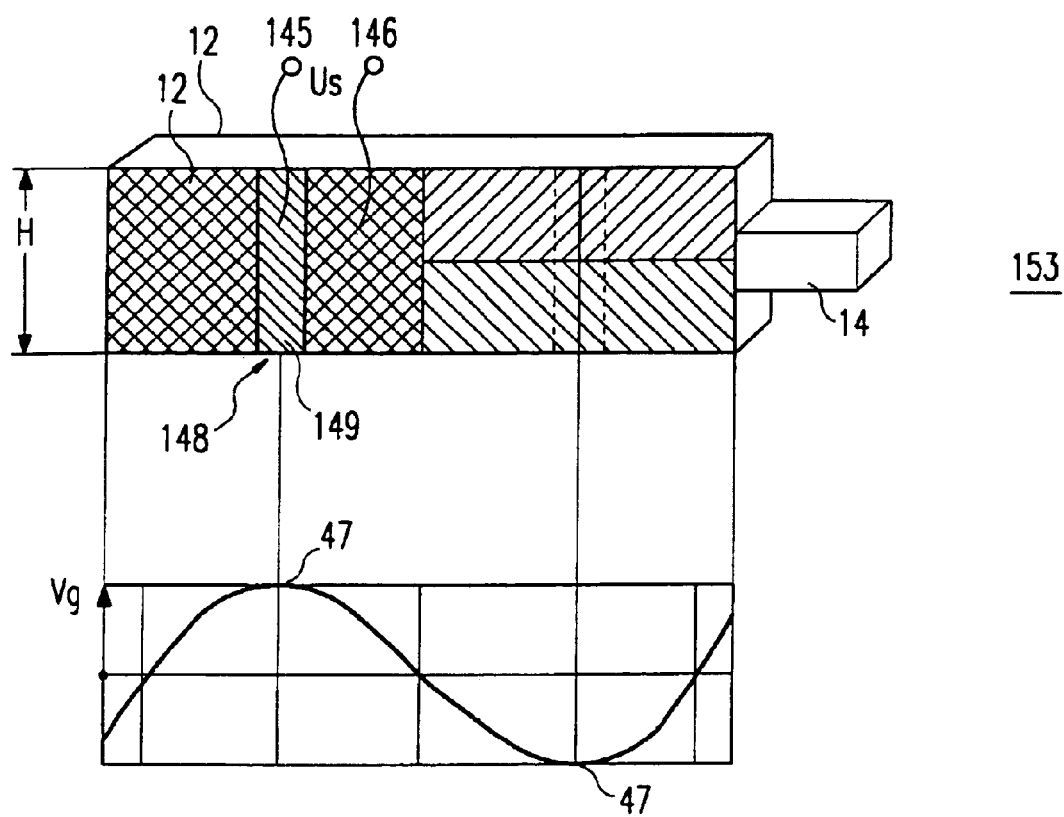

Position 147 according to FIG. 42 shows the sensor 148 for the determination of components of mechanical bending stresses. This sensor is employed only together with oscillators of the longitudinal type according to FIG. 10. The sensor itself is designed in t he form of a piezoelectric plate 149 with a thickness ranging form 0.1 to 0.3 mm. The plate height $h_s$ is equal to the oscillator width H. The plate comprises continuous electrodes 150 on its large surface. The plate 143 is divided into two equal parts 151 and 152 with respect to the dimension h1. These parts are realised in the normal direction to t he electrode surface, but with a differently directed polarised piezoelectric ceramic, as is symbolised by the arrows in position 147. The sensor 148 is attached on the large surface 7 of the oscillator 6 at the site of one of the oscillation velocity maxima 47 of the standing acoustic flexural wave and symmetrically with respect to the longitudinal axis of the transducers 6 (see FIG. 41, pos. 153). Locating in position of the sensor 148 is done in same manner as described for the sensor 141.

Figure 43:
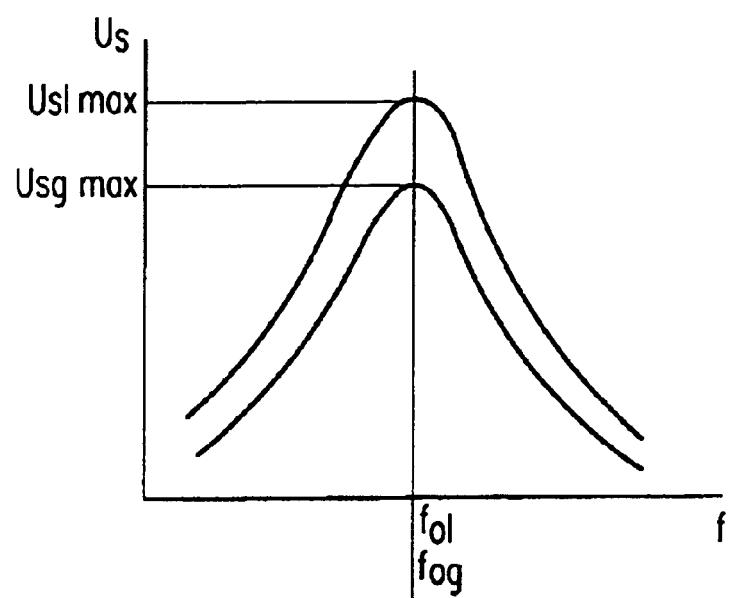
Figure 43:
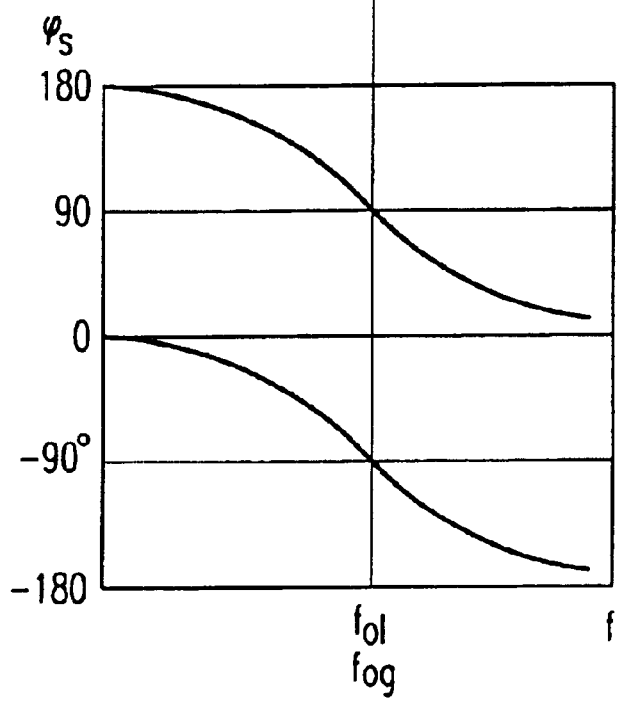

FIG. 43, position 154, shows frequency dependencies of the electric voltages Usl and Usg at the electrodes 143, 150 of the sensors 141, 148. Their maximum values Ustmax and Usgmax correspond to the resonance frequencies of the longitudinal and flexural oscillations of the transducer 6 ($f_{ol}$ as well as $f_{og}$).

Position 155 according to FIG. 43 shows the dependency of the phase shift angle φs between the excitation voltage Ue and the voltage Usl or Usg at the electrodes 143 or 150 of the sensors 141 or 148. The dependencies differ according to the orientation of the sensors with respect to the direction of polarisation.

Figure 44:
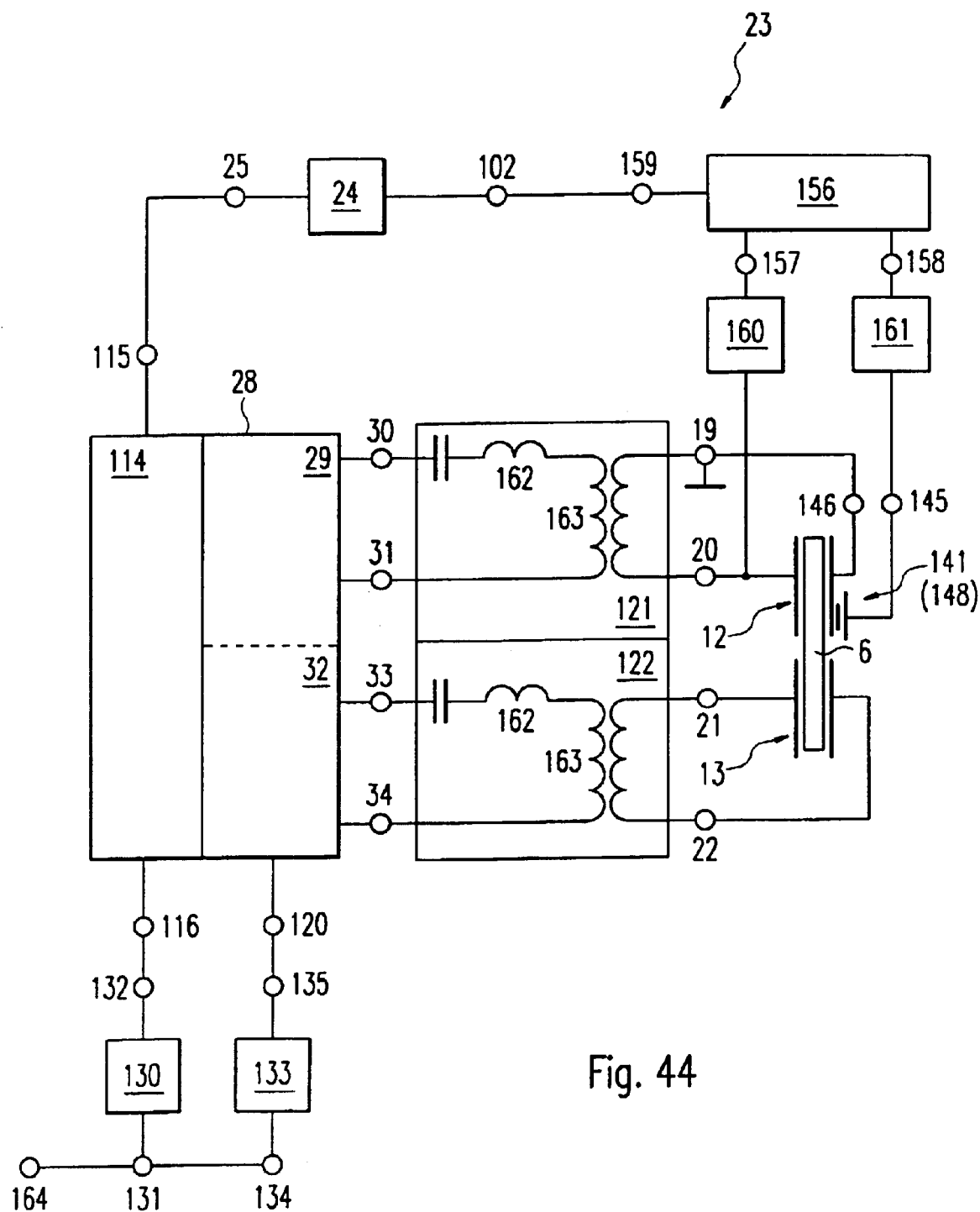

FIG. 44 shows a circuit version where in the source of the electric excitation of acoustic oscillations 23 is provided with a phase detector 156. The same includes the support input 157 and the measuring input 158 as well as the output 159. The support input 157 of the phase detector 156 is connected with the first connection 20 of the first electrode group 12 or with the connection 21 of the second electrode group 13 via a support signal shaping member. The measuring input 158 is connected with the connection 145 of the sensor 141 or the sensor 148 via a signal shaping member 161. The output of the phase detector 149 is connected with the control input of the excitation frequency 102 of the basic generator 24. With this version the filters 121 and 122 are designed in the form of an LC member 162 and under the utilisation of a summing transformer 163. The drive comprises the common control input 164.

The motor or drive described in the embodiments is based on the simultaneous independent electric excitation of a piezoelectric transducer with respect to the standing longitudinal and the standing pure flexural wave. In the various versions, the first, second, third, and fourth of the modes of the longitudinal wave can be combined with the second, third, fourth, fifth, sixth, and seventh modes of the flexural wave.

The combination of the modes is determined by the ratio of the length L to the width H of the transducer 6, which is constant and independent of the type of piezoelectric ceramic for the s elected mode combination. It can be specified as an orientation that the ratio L/H for the ⅖ mode oscillator is approx. 10, for the ½ mode oscillator approx. 4, and for the ⅜ mode oscillator approx. 8. With an optimum selection of the ratio L/H the resonance frequencies of the longitudinal oscillations and of the flexural oscillation are identical as symbolised in FIG. 2. Too great a difference between the frequencies $f_{ol}$ and $f_{og}$ indicates an insufficient or wrong selection of the ratio L/H, which has a negative influence on the motor operation. As a rule, the difference Δf between the above mentioned frequencies shall not be greater than 1%.

In the described motor the excitation of the acoustic longitudinal wave is achieved by at least one generator which is formed by a first electrode group. The excitation of the acoustic flexural wave is achieved by means of least one further generator which is formed by the second electrode group. The configurations of the electrode groups are such that the generators are not connected electrically and mechanically with each other and are thus able to produce pure longitudinal or flexural waves. The term pure flexural wave implies that it does not comprise a longitudinal component. A pure longitudinal wave should not contain any flexural components. The action of both waves on the friction elements leads to an elliptic movement. The points of the function faces of the friction elements have trajectories which differ only slightly from one another.

In the version of the drive described with reference to FIG. 1 the required time phase shift between the waves is determined by the construction of the transducer. The motor according to FIG. 1 includes a ⅖ mode oscillator with the electrode group configuration shown in FIG. 4. In such an oscillator the first electrode group 12 forms co-phasal longitudinal wave generators 17. These generate the second mode of the acoustic longitudinal wave in the oscillator or transducer. The distribution diagrams of the oscillation velocities of this wave along the oscillator length L can be seen in FIG. 3, position 37. The second electrode group 13 forms a flexural wave generator 18 which generates the fifth mode of the standing acoustic flexural wave in the oscillator or transducer 6, respectively. Position 38 of FIG. 3 shows the corresponding distribution diagrams. Due to the fact that the amplitudes of the longitudinal and flexural oscillations of the transducer are significantly smaller than its dimensions, the waves have no interfering interactions, i.e. they propagate independent of each other in the oscillator or transducer 6. Due to this simultaneous propagation all points of the oscillator surfaces 8 move on elliptic paths. The shape of the trajectories and the direction of movement of the points change along the oscillator length and depend on the amplitudes and phases of the oscillations of the individual points caused by each wave.

FIG. 3, position 42, shows shapes of trajectories and directions of movement of points a, b, c, d which are located on the lower surfaces 9 in the oscillation velocity maxima 47 of the standing acoustic flexural wave along the lines which extend perpendicular to its large surfaces 7. The elliptic trajectory along the oscillator length L is disposed in these points. The areas of the maxima 47 have proven to be the optimum for the attachment of friction elements 12. In these areas all points of the friction elements 12 move virtually along the same paths. FIG. 3, positions 42 to 46, shows possible locations for the attachment of friction elements 14, which correspond to the defined maxima 47.

The elliptical movements of the points on the lower surface 9 cause the friction elements 14 located there to perform an elliptic movement. Due to the fact that the friction elements make a corresponding elastic contact with the friction layer 2 of the driven element, a corresponding unidirectional movement of the driven element 1 is produced. In order to avoid a displacement of the transducer 6 in an opposite orientation to the direction of the driven element, it is equipped with at least one fixing element 15. These fixing elements 15 are disposed in areas of the oscillation velocity nodes 39 of the standing acoustic longitudinal wave. In the areas 39 the oscillation amplitude of the transducer 6 is small so that minimum losses occur.

The configuration versions of the electrode groups 12 and 13 of a ⅖ mode oscillator according to FIGS. 5 and 6 differ in the different number of generators 17 and 18 as well as by the generation of the flexural wave.

Figure 17:
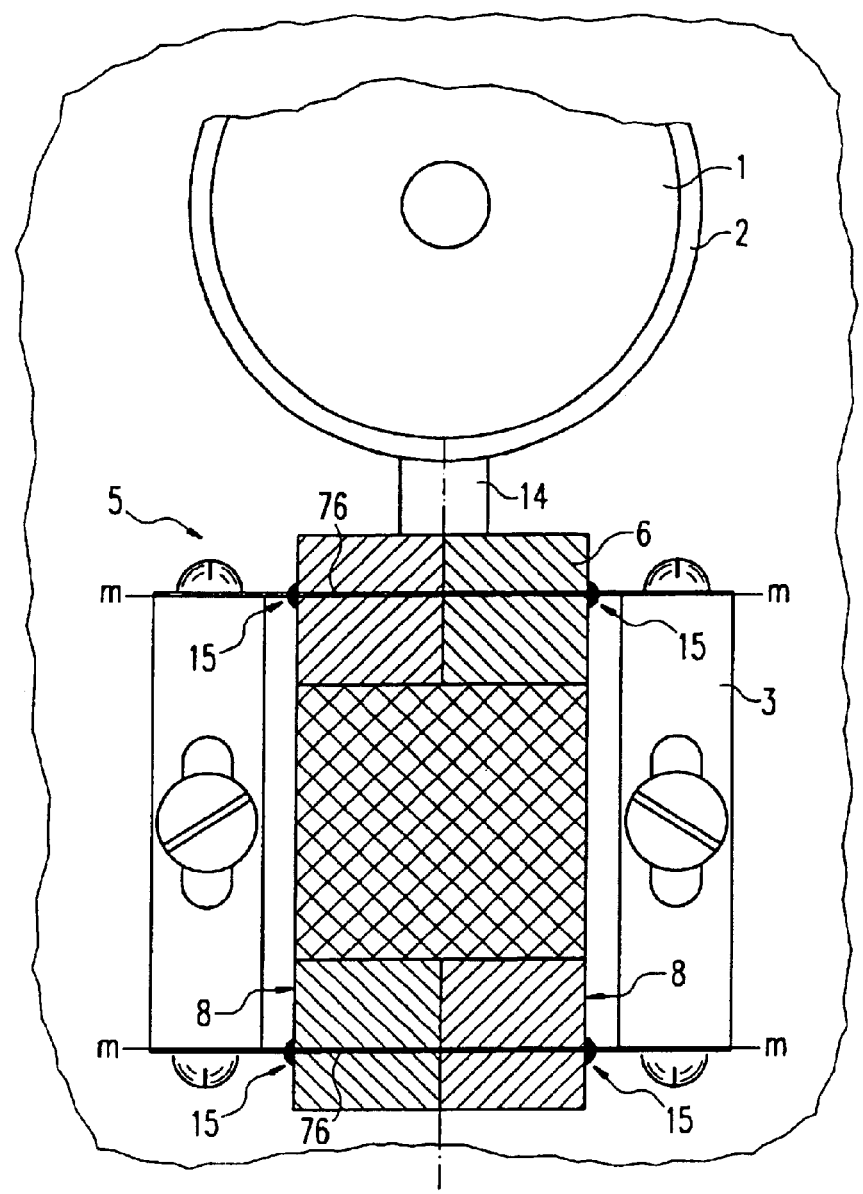
Figure 18:
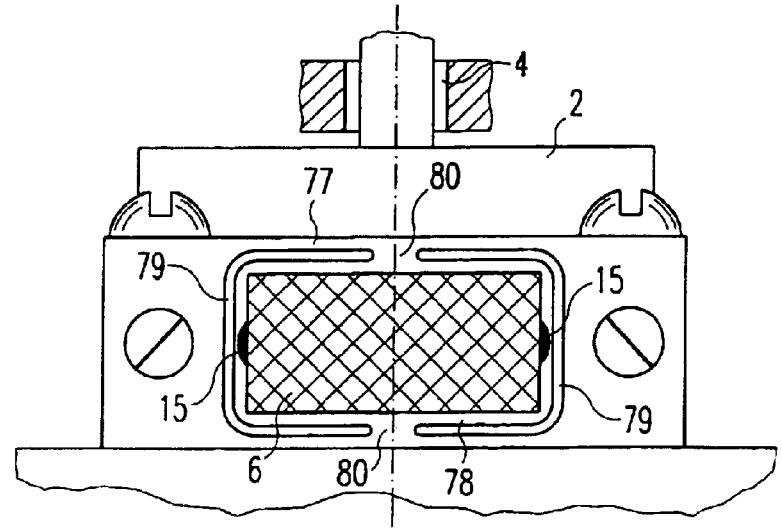

FIG. 9 shows a ½ mode oscillator or transducer 6 of the longitudinal type. With this type the transducer 6 is arranged along the friction layer 2 as can also be seen from FIG. 16. In the ½ mode oscillator of the transverse type according to FIG. 10 a friction element 14 is disposed in the centre of a small lateral face of the oscillator. The oscillator or transducer 6 is thereby aligned transversely or perpendicular to the friction layer 2 as is shown in FIGS. 17 and 18.

In both design versions of the motor first modes of the longitudinal wave and second modes of the flexural wave are generated in the transducer 6 by means of the generators 17 and 18. The propagation of these waves causes the desired elliptic movement of the friction elements 14 which cause the driven element to perform a unidirectional movement. Configuration versions of the electrode group 12 and 13 of a ½ mode oscillator are illustrated in FIGS. 11 to 15.

FIGS. 19 to 21 in turn disclose configuration versions of the electrode groups of a ⅜ mode oscillator, with FIG. 22 showing a motor version which is equipped with such transducers or oscillators. Such a motor may have a transducer which, on its lower surface 9, comprises two or four friction elements 14 as is shown in FIG. 19 with position 85. In the illustrated motor version the transducer 6 has three fixing elements 15, thus improving its mechanical stability.

In the drive or motor the energy transmission from the oscillating transducer 6 to the driven element 1 is effected by the frictional contact between the friction element 14 and the friction layer 2. The use of two- or three-layer friction elements 14 with a porous layer 18 enables a compensation of the differences of the elliptic trajectories towards the friction element width $h_r$, where reference must be made to FIG. 23. This is due to the fact that the porous layer significantly reduces the transverse deformation component of the friction element 14. In order to obtain a high homogeneity and uniformity of the trajectories in the width tr, narrow friction elements are advantageously used which are illustrated in FIG. 23 with positions 87, 89, and 90.

The use of wide friction elements enables the transmission of high tensile forces. When using wide friction elements 14 it must be observed that their width tr must be five times smaller than one half-wave length $\lambda/2$ of the acoustic flexural wave which propagates in the oscillator or transducer 6.

In order to avoid the undesired generation of acoustic flexural waves in the body of the driven element 1, the thickness 1 of the body of the driven element 1 should be greater than one half-wave length $\lambda/2$ of the acoustic flexural wave which propagates in the plate-shaped transducer. In order to ensure an improved acoustic insulation of the driven element 1 against the friction layer 2, a damping intermediate layer 74 may be arranged between the body of the driven element 1 and its friction layer 2, which consists of a sound-absorbing material. Such a layer also enables the elimination of the thermal incompatibility of the friction layer 2 and the driven element 1, which is due to a difference in the temperature expansion coefficients. The damping layer 74 may be manufactured from a soft organic material, e.g. it can consist of a polymer film or be formed from a porous material such as porous aluminium. A combination of a hard material with a soft organic material is also conceivable.

In order to extend the application possibilities of the drive the driven element may be designed as a bar with a rectangular, polygonal, or round cross-section or in the form of a tube.

Figure 30:
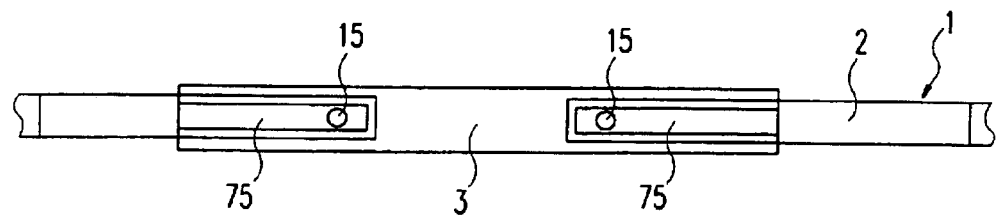

In a design version of the motor with at least three piezoelectric transducers and at least three friction layers which are parallel to each other and are arranged in at least one of the planes S1, S2, and S3 as is shown in FIG. 30, the driven element 1 is mechanically very stable in its plane perpendicular to the longitudinal axis. In order to obtain a rotational movement the driven element may be manufactured as a rotating body and placed in rotating carriers as can be seen from FIGS. 17 and 18. In order to increase the positioning accuracy there is the possibility to place the fixing elements of the transducer 6 in rigid girders 100 as is shown in FIG. 30. Here, the transducer 6 is located in position absolutely rigidly in the longitudinal direction with respect to the motor housing 3.

The following should be noted with respect to the mode of functioning of the embodiments of the circuit arrangements for operating the drive or motor from FIG. 32 onwards.

A simple version for the generation of acoustic oscillations is shown in FIG. 32 which is equipped with a phase shifter 101. This phase shifter is used for a fine correction of the phase shift between the voltages Uf1 and Uf2. Such a correction is required in certain cases for the optimisation of the trajectories of the friction elements 14. In addition, the basic generator 24 comprises an input for controlling the exciter frequency. The control input enables the variation of the movement velocity of the driven element.

In the circuit arrangement according to FIG. 33 the basic generator 24 provides a square-wave voltage Ug with a frequency which is equal to twice the resonance frequency fl0 of the longitudinal oscillation of the transducer. This voltage is applied at the input 115 of the phase controller 114 and there reshaped into a saw tooth voltage by means of the member 123. This saw tooth voltage reaches a pulse width modulator 124. At the input 116 of the pulse width modulator 124, which is simultaneously the control input of the phase controller, the control voltage $U\phi$ is additionally applied. The pulse modulator 124 reshapes the saw tooth voltage from the member 123 into a square-wave voltage whose pulse width is proportional to the control voltage $U\phi$ applied at its input 116. This voltage reaches the shaping members 125 and 126 which are designed as a flip-flop and which react to the trailing and leading edge of the pulse width-modulated voltage.

Thus, symmetrical square-wave pulses result at the outputs 117 and 118 of the phase controller 114. Their frequency is equal to the frequency fl0 of the longitudinal oscillations of the transducer and their phase shift $\phi b$ is proportional to the voltage $U\phi$. The dependency of the phase shift $\phi b$ from the control voltage is shown in FIG. 35.

The square-wave voltages of the outputs 117 and 118 are further directed to the drivers 113 and then to the half-bridge amplifiers 105, 106 and 107, 108. At the outputs 30, 33 and 31, 34 of the half-bridge amplifiers 105, 106 and 107, 108 square-wave voltages Ub1 and Ub2 are generated. Their phase shift $\phi b$ is proportional to the control voltage $U\phi$. The phase shift $\phi b$ between the voltages Ub1 and Ub2 determines the time during which these voltages act on the load of the bridge amplifiers 103 and 104 and, as such, subject the first and the second electrode group of the transducer.

The voltages Ub1 and Ub2 reach the connections 19, 20 and 21, 22 of the first 12 and the second 13 electrode group of the transducer 6 via the filters 121 and 122. The filters 121 and 122 pass only the first harmonic of the oscillations produced by these voltages. Between the connections 19, 20 and 21, 22 sinusoidal voltages Ue occur with a frequency which is equal to the resonance frequency fl0 of the longitudinal oscillations of the transducer and with an amplitude which is proportional to the phase shift 1b. FIG. 36 shows the time diagrams phase shift $\phi b$. Due to the fact that the movement velocity Vf of the driven element 1 is proportional to the voltages Ue, a reverse proportionality to the control voltage $U\phi$ results, which is applied at the input 116 of the phase controller 114.

The changeover of the electronic switch 119 causes a phase shift by 180° between the voltages at the connections 19, 20 and 21, 22 of the first 12 and the second 13 electrode group of the transducer 6. This leads to a change in direction of the movement of the driven element.

In the circuit arrangement according to FIG. 39 the control voltage Ur is applied at the input 131 of the signal level transducer 130 and at the input 134 of the zero signal detector 133. The transducer 130 has a double dependency between the voltage $U\phi$ at its output 132 and the control voltage Ur at its input 131. This dependency is shown in FIG. 40 with position 136. When viewing the position 137 it can be seen that up on the passage of the voltage Ur the zero signal detector 133 changes over on the half-value side as is explained in FIG. 40, position 138. The changeover of the zero signal detector leads to a change in movement of the driven element into t he opposite direction. The resulting dependency of the movement velocity Vf of the driven element 1 from the control voltage Ur is shown in FIG. 40 with position 139. The zero velocity of the driven element 1 corresponds approximately to half the control voltage Ur.

In the circuit version of FIG. 44 for the operation of the motor the constant phase shift is utilised for the frequency stabilisation of the motor working point. For this purpose the sensor of the mechanic stress component 141 or 148 provides a sinusoidal voltage which is fed to the connections 146 and 145 and further to the shaper 161. This voltage is amplified and limited by the shaper 161 in such a manner that a square-wave distribution curve develops. The thus reshaped voltage reaches the measuring input 158 of the phase detector 156. The voltage exciting the transducer 6, which was signal-converted by the shaper 160 is applied at the support input 157 of the phase detector 156. The phase detector 156 provides a fault voltage which is proportional to the deviation of the phase shift between the voltages at the inputs 157 and 158. This fault voltage from the output 159 of the phase detector 156 reaches the input 102 for electrically controlling the carrier frequency of the basic generator 24.

The system is adjusted in such a manner that with the lack of destabilising values the fault voltage is equal to zero and the basic generator produces a frequency which is equal to twice the resonance frequency flo of the longitudinal oscillations of the transducer. The phase shift is equal to +90° or equal to −90°.

The influence of destabilising factors leads to a deviation of the oscillator resonance frequency from the initial value whereby the phase shift is changed. The latter causes the generation of a fault voltage at the output 159 of the phase detector 156. This fault voltage changes the frequency of the basic generator in such a manner that the phase shift will then again be +90° or −90°. The exciter frequency of the basic generator will then be again equal to the new value of twice the resonance frequency of longitudinal waves of the transducer 6.

The system thus always maintains the exciter frequency of the basic generator equal to the resonance frequency of the longitudinal oscillations of the transducer 6. Therefore, the circuit arrangement is capable of maintaining constant the resonance frequency of the oscillator even with mechanical loads or temperature fluctuations. At the control input 164 there is the possibility to connect an electric stabilisation system for maintaining constant the movement velocity of the driven element.

Tests with an inventive motor have shown that with a ⅔ mode oscillator with the dimensions of 60×6×3 mm, comprising an electronic arrangement for maintaining constant the resonance frequency of the oscillator, the non-uniformity of the velocity of the driven element is in the range from 5 to max. 10% with a movement velocity of 0.01 m/s. At velocities higher than 0.1 m/s a non-uniformity in the velocity constancy lies within 2%. With the employment of an electronic stabilisation system the uniformity at a movement velocity of 1 $\mu$m/s can be maintained at a deviation of 2 to 3%. Such a stability was maintained over the entire motor operating period of 10,000 hours. The embodiments of the proposed drive are in an operating condition already at exciter voltages in the range from 20 to 150 V. Tests with a motor with a ½ mode oscillator of longitudinal type with the dimensions 70×18.5×6 mm and friction elements resulted generated forces in the order 52 N.

| List of reference numerals | |
|---|---|
| 1 | Driven element |
| 2 | Friction layer |
| 3 | Housing |
| 4 | Bearings |
| 5 | Driving element |
| 6 | Oscillator or transducer |
| 7 | Large surfaces |
| 8 | Small surfaces |
| 9 | Lower surface |
| 10 | Upper surface |
| 11 | Small lateral surfaces |
| 12 | First electrode group |
| 13 | Second electrode group |
| 14 | Friction elements |
| 15 | Fixing elements |
| 16 | Pressure device |
| 17 | Longitudinal waves; longitudinal wave generator |
| 18 | Flexural waves; flexural wave generator |
| 19, 20, 21, 22 | Electrical connections |
| 23 | Oscillations; excitation source |
| 24 | Basic generator |
| 25 | Output |
| 26, 27 | Signal inputs |
| 28 | Power amplifier |
| 29 | First channel |
| 30 | Non-inverting output |
| 31 | Inverting output |
| 32 | Second channel |
| 33 | Non-inverting output |
| 34 | Inverting output |
| 35, 36 | Curve |
| 37, 38 | Oscillation velocities |
| 39 | Oscillation velocity nodes |
| 40 | Oscillation velocity antinodes or maxima |
| 41, 42, 43, 44, 45, 46 | Positions |
| 47 | Defined maxima |
| 48, 49 | Electrodes |
| 50, 51 | Electrodes |
| 52 | Insulating intermediate areas |
| 53, 54 | Parts |
| 55, 56; 57, 58 | Conductors |
| 59, 60 | Current conducting strips |
| 61 | Current conducting strips |
| 62, 63 | Positions |
| 64 | Position |
| 65, 66 | Positions |
| 71, 72 | Conductors |
| 73 | Current conducting strips |
| 74 | Damping layer |
| 75 | Flat spring |
| 76 | Resonance plates |
| 77 | Outer frame |
| 78 | Inner frame |
| 79 | Intermediate gaps |
| 80 | Bridges |
| 81, 82 | Positions |
| 83 | Position |
| 85 | Position |
| 86 | Girders |
| 87, 88, 89, 90, 91, 92 | Positions |
| 87 | First layer |
| 88 | Second layer |
| 89 | Transition layer |
| 89 | Rectangular prism |
| 90 | Triangular prism |
| 89–98 | Positions |
| 91 | Semi-cylindrical prism |
| 92 | Conical element |
| 93 | Pyramid-shaped element |
| 94 | Semi-spherical element |
| 95, 96 | Rectangular elements with profile grooves |
| 97, 98 | Round elements with profile holes |
| 90–92 | Positions |

-continued

| List of reference numerals | |
|---|---|
| 93–96 | Positions |
| 97, 98 | Positions |
| 99 | Damping grooves or recesses |
| 100 | Girder |
| 101 | Phase shifter |
| 102 | Excitation frequency |
| 103, 104 | Amplifiers |
| 105, 106; 107, 108 | Half-bridge amplifiers |
| 109, 110; 111, 122 | Excitation channels |
| 114 | Signal phase controller |
| 116 | Control input |
| 117 | Support voltage input |
| 118 | Output |
| 119 | Electronic changeover switch |
| 120 | Control input |
| 121 | Filter |
| 122 | Filter |
| 123 | Saw tooth voltage shaping member |
| 124 | Pulse duration modulator |
| 125 | Support voltage shaper |
| 126 | Shaper for the phase variable voltage |
| 129–129 | Positions |
| 130 | Signal level transducer |
| 131 | Control input |
| 132 | Output |
| 133 | Zero signal detector |
| 134 | Control input |
| 135 | Control output |
| 136 | Position |
| 137 | Position |
| 138 | Position |
| 139 | Position |
| 140 | Position |
| 141 | Sensor |
| 142 | Piezoelectric plate |
| 143 | Electrode |
| 144 | Position |
| 145 | Sensor output |
| 146 | Output |
| 147 | Position |
| 148 | Sensor |
| 149 | Piezoelectric plate |
| 150 | Electrodes |
| 151, 152 | Parts |
| 153 | Position |
| 154 | Position |
| 155 | Position |
| 156 | Phase detector |
| 157 | Support input |
| 158 | Measuring input |
| 159 | Output |
| 161 | Signal shaping member |
| 162 | LC member |
| 163 | Summing transformer |
| 164 | Control input |

What is claimed is:

1. A piezoelectric drive which comprises a driven element provided with a friction layer and at least one monolithic plate-shaped piezoelectric transducer including large and smaller surfaces as the driving element, whose length is not equal to its width, as well as with first and second electrode groups on its large surfaces and with at least one friction element on its smaller surface being in elastic friction contact with the friction layer of the driven element, and further with an electric generator which is electrically connectable with the first and second eletrode groups, with the first and electrode group representing representing two areas of identical configuration on the two large opposite surfaces of the plate-shape piezoelectric transducer, which are metallized, and the first electrode group being a longitudinal wave generator and the second electrode group being a flexual wave generator for acoustic waves, wherein each of the first and second electrode groups forms at least one independent transducer of acoustic standing waves not coupled to each other which propagate along the long side of the piezoelectric transducer, a unidirectionally polarized piezoelectric ceramic oriented perpendicular to the first electrode group and arranged between the first and second electrode groups is located in sites of oscillation velocity nodes of the standing acoustic longitudinal wave propating in the transducer, and a piezoelectric ceramic which is oriented perpendicular to the electrodes and arranged between the electrodes and is unidirectionally polarized or heterodirectionally symmetrically polarized with respect to the longitudinal axis of the transducer, which is disposed in sites of oscillation velocity maxima of the standing acoustic flexual wave propagating in the transducer.

2. The piezoelectric drive according to claim 1, wherein the first electrode group represent rectangular areas of the metalized surface of the plate-shaped piezoelectric transducer whose height and width are equal, and with a unipolarized piezoelectric ceramic oriented perpendicular to the electrodes and arranged between the electrodes, which is disposed in sites of oscillation velocity nodes of the standing acoustic wave propagating in the transducer.

3. The piezoelectric drive according to claim 1, wherein the second electrode group represents rectangular areas of the metallized surface of the plate-shaped piezoelectric transducer whose height and width are equal, and with a unipolarized piezoelectric ceramic oriented perpendicular to the electrodes and arranged between the electrodes, which is disposed in sites of oscillation velocity maxima of the standing acoustic wave propagating in the transducer, which include insulating spacings along its longitudinal axis.

4. The piezoelectric drive according to claim 1, wherein the second electrode group represents rectangular areas of the metallized surface of the plate-shaped piezoelectric transducer whose height and width are equal, and with a piezoelectric ceramic which is oriented perpendicular to the electrodes and arranged between the electrodes and heterodirectionally symmetrically polarized with respect to the longitudinal axis of the transducer, with the electrode group being arranged in sites of the oscillation velocity maxima of the standing acoustic flexural wave propagating in the transducer.

5. The piezoelectric drive according to claim 1, wherein the friction elements are configured as thin strips of a hard, wear-resistant material and arranged in areas of oscillation velocity maxima of the acoustic flexural wave propagating in the plate-shaped piezoelectric transducer.

6. The piezoelectric drive according to claim 5, wherein the friction elements are disposed on a small lower surface of the plate-shaped piezoelectric transducer.

7. The piezoelectric drive according to claim 1, wherein one of the friction elements is arranged on one of the small lateral surfaces of the plate-shaped piezoelectric transducer.

8. The piezoelectric drive according to claim 1, wherein the friction elements have a two-layer or three-layer structure, with the first layer of this structure including a hard, wear-resistant substance with a high friction factor compared to the friction layer of the driven element, and the second layer including a hard, porous material, and both layers are bonded with each other by sintering so that in an interface area of the first and the second layer a third transition layer is generated in between.

9. The piezoelectric drive according to claim 1, wherein the friction elements are bonded with the surface of the plate-shaped piezoelectric transducer by a bonding agent that chemically reacts both with the piezoelectric ceramic and the material of the friction element.

10. The piezoelectric drive according to claim 1, wherein the friction elements are formed as glass strips that are fused onto the surface of the plate-shaped piezoelectric transducer, with the glass comprising a powder additive of a hard, wear-resistant material.

11. The piezoelectric drive according to claim 1, wherein the monolithic plate-shaped piezoelectric transducer is equipped with at least one fixing element securely joined.

12. The piezoelectric drive according to claim 11, wherein the fixing elements are designed as rectangular, triangular, semi-cylindrical prism or as conical, pyramid-shaped, semispherical elements with profile holes and arranged in the sites of oscillation nodes of the standing acoustic longitudinal wave propagating in the transducer and are rigidly joined with the piezoelectric ceramic surface.

13. The piezoelectric drive according to claim 12, wherein the fixing elements include a material whose modulus of elastically is approximately equal to or slightly higher than that of the piezoelectric ceramic.

14. The piezoelectric drive according to claim 12, wherein the fixing elements include a material whose modulus of elastically is much smaller than the modulus of elasticity of the piezoelectric ceramic of the plate-shaped piezoelectric transducer.

15. The piezoelectric drive according to claim 12, wherein the fixing elements and the plate-shaped piezoelectric transducer include a same type of piezoelectric ceramic.

16. The piezoelectric drive according to claim 1, wherein each fixing element includes porous oxide ceramic or of another porous material.

17. The piezoelectric drive according to claim 1, wherein the fixing elements are designed as bending resonance plates.

18. The piezoelectric drive according to claim 1, wherein the fixing elements are joined with the piezoelectric ceramic surface by organic adhesives.

19. The piezoelectric drive according to claim 1, wherein the fixing elements are joined with the piezolectric ceramic surface of a material that chemically reacts with the piezolectric ceramic and the material of the fixing element.

20. The piezoelectric drive according to claim 1, wherein the friction layer of the layer of the driven element is a ceramic oxide layer with a thickness at least five times smaller than a half-wave length ($\lambda/2$) of the acoustic standing longitudinal wave propagating in the transducer.

21. The piezoelectric drive according to claim 1, wherein a the body thickness of the driven element located below the friction layer is greater than a half-wave length ($\lambda/2$) of the acoustic standing flexural wave propagating in the transducer.

22. The piezoelectric drive according to claim 1, further comprising:
a damping layer arranged between the body of the driven element and its friction layer.

23. The piezoelectric drive according to claim 1,
wherein the driven element has a shape of a bar comprising a rectangular, polygonal, or round cross-section.

24. The piezoelectric drive according to claim 1,
wherein the driven element has a shape of a tube.

25. The piezoelectric drive according to claim 1,
wherein the driven element is a bar of hard material with a rectangular cross-section, whose bar body comprises periodic damping grooves.

26. The piezoelectric drive according to claim 1,
wherein the driven element includes a hard, porous material.

27. The piezoelectric drive according to claim 1,
wherein pores of the porous driven element are filled up with a sound-absorbing substance.

28. The piezoelectric drive according to claim 1,
wherein at least two plate-shaped piezoelectric transducer arranged opposite each other and lying in one plane are provided with at least two friction layers and the transducer are parallel to each other and are disposed on two opposite sides of the driven element.

29. The piezoelectric drive according to claim 1,
wherein at least three plate-shaped piezoelectric transducer with at least three friction layers are provided that are parallel to each other and that lie in at least three planes.

30. The piezoelectric drive according to claim 1,
wherein the driven elements is configured as a rotating body and placed in a rotating girder.

31. The piezoelectric drive according to claim 1,
wherein the fixing elements of the plate-shaped piezoelectric transducer are located in stationary girders.

32. The piezoelectric drive according to claim 1,
wherein the fixing elements of the plate shaped piezoelectric transducer are fastened in flat spring-type carriers.

* * * * *